US012785653B2

(12) United States Patent
Tsukada et al.

(10) Patent No.: US 12,785,653 B2
(45) Date of Patent: Nov. 3, 2026

(54) ACOUSTIC WAVE RESONATOR, FILTER, AND MULTIPLEXER

(71) Applicant: TAIYO YUDEN CO., LTD., Tokyo (JP)

(72) Inventors: Mayu Tsukada, Tokyo (JP); Shodai Harai, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 783 days.

(21) Appl. No.: 18/322,254

(22) Filed: May 23, 2023

(65) Prior Publication Data

US 2023/0387882 A1 Nov. 30, 2023

(30) Foreign Application Priority Data

May 26, 2022 (JP) ................................ 2022-086225

(51) Int. Cl.
*H03H 9/145* (2006.01)
*H03H 9/64* (2006.01)
*H03H 9/72* (2006.01)

(52) U.S. Cl.
CPC .......... *H03H 9/145* (2013.01); *H03H 9/6413* (2013.01); *H03H 9/6483* (2013.01); *H03H 9/72* (2013.01)

(58) Field of Classification Search
CPC .. H03H 9/02559; H03H 9/145; H03H 9/6413; H03H 9/6483; H03H 9/02858; H03H 9/72
See application file for complete search history.

(56) References Cited

U.S. PATENT DOCUMENTS

| | | | | |
|---|---|---|---|---|
| 8,085,116 B2 * | 12/2011 | Miura | H03H 9/1457 333/195 |
| 2013/0051588 A1 | 2/2013 | Ruile et al. | 381/190 |
| 2015/0123746 A1 | 5/2015 | Nakamura et al. | |
| 2022/0360249 A1 * | 11/2022 | Ballandras | H03H 9/02858 |
| 2025/0175141 A1 * | 5/2025 | Tsukada | H03H 9/25 |

FOREIGN PATENT DOCUMENTS

| | | | |
|---|---|---|---|
| JP | 2013-518455 A | 5/2013 | |
| JP | 2015-89069 A | 5/2015 | |
| JP | 2016-178387 A | 10/2016 | |
| WO | WO-2018057956 A1 * | 3/2018 | H03H 9/14544 |

* cited by examiner

*Primary Examiner* — J. San Martin
(74) *Attorney, Agent, or Firm* — Stein IP, LLC

(57) ABSTRACT

An acoustic wave resonator includes comb-shaped electrodes each including electrode fingers and dummy electrode fingers, first tips of the electrode fingers of one of the comb-shaped electrodes and second tips of the dummy electrode fingers of the other facing each other, each dummy electrode finger including a first portion located closer to the corresponding second tip and a second portion located farther from the corresponding second tip than the first portion, the first portion being narrower in a short direction than the second portion, and an insulating film that is provided from an edge region of an overlap region to a first region, where the first portions of the dummy electrode fingers are located, of a dummy region and is provided in neither a central region of the overlap region nor a second region, where the second portions of the dummy electrode fingers are located, of the dummy region.

19 Claims, 15 Drawing Sheets

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2022-086225, filed on May 26, 2022, the entire contents of which are incorporated herein by reference.

FIELD

A certain aspect of the present disclosure relates to an acoustic wave resonator, a filter, and a multiplexer.

BACKGROUND

In high-frequency communication systems typified by mobile phones, high-frequency filters are used to remove unnecessary signals with frequencies outside the frequency band used for communication. An acoustic wave resonator is used for the high-frequency filter. As an acoustic wave resonator, there is known an acoustic wave resonator including a pair of comb-shaped electrodes each including a plurality of electrode fingers, a plurality of dummy electrode fingers, and a bus bar to which the electrode fingers and the dummy electrode fingers are connected. As a method of reducing spurious emissions without impairing the Q factor, an acoustic wave resonator using a piston mode is known as disclosed in, for example, Japanese Patent Application Laid-Open Nos. 2015-89069, 2016-178387, and 2013-518455.

SUMMARY

The piston mode can be achieved by providing an insulating film in each of edge regions located at respective edges in the extending direction of the electrode fingers of an overlap region where the electrode fingers of one of the pair of comb-shaped electrodes overlap the electrode fingers of the other of the pair of comb-shaped electrodes. However, the edge region where the insulating film is provided is shortened due to the recent increase in frequency. Therefore, the insulating film may be formed from the edge region to a dummy region where the dummy electrode fingers are located. In this case, the effect of reducing spurious emission may deteriorate.

Therefore, an object of the present disclosure is to reduce spurious emissions.

In one aspect of the present disclosure, there is provided an acoustic wave resonator including: a piezoelectric substrate; a pair of comb-shaped electrodes provided on the piezoelectric substrate, each of the pair of comb-shaped electrodes including electrode fingers, dummy electrode fingers, and a bus bar to which the electrode fingers and the dummy electrode fingers are connected, first tips of the electrode fingers of one of the pair of comb-shaped electrodes and second tips of the dummy electrode fingers of another of the pair of comb-shaped electrodes facing each other, each of the dummy electrode fingers including a first portion located at a side of the corresponding second tip and a second portion located at an opposite side of the corresponding second tip across the first portion, the first portion having a smaller width in a short direction than the second portion; and an insulating film that is provided on the piezoelectric substrate from an edge region of an overlap region to a first region of a dummy region and is not provided in a central region of the overlap region or in a second region of the dummy region, the edge region being a region located at each of edges in a longitudinal direction of the electrode fingers in the overlap region, the overlap region being a region where the electrode fingers of the one of the pair of comb-shaped electrodes overlap the electrode fingers of the another of the pair of comb-shaped electrodes, the first region being a region where the first portions of the dummy electrode fingers are located in the dummy region, the dummy region being a region where the dummy electrode fingers are located, the central region being a region located further in than the edge region in the overlap region, the second region being a region where the second portions of the dummy electrode fingers are located in the dummy region.

In another aspect of the present disclosure, there is provided an acoustic wave resonator including: a piezoelectric substrate; a pair of comb-shaped electrodes provided on the piezoelectric substrate, each of the pair of comb-shaped electrodes including electrode fingers, dummy electrode fingers, and a bus bar to which the electrode fingers and the dummy electrode fingers are connected, first tips of the electrode fingers of one of the pair of comb-shaped electrodes and second tips of the dummy electrode fingers of another of the pair of comb-shaped electrodes facing each other, each of the dummy electrode fingers including a first portion located at a side of the corresponding second tip and a second portion located at an opposite side of the corresponding second tip across the first portion, the first portion being thinner than the second portion; and an insulating film that is provided on the piezoelectric substrate from an edge region of an overlap region to a first region of a dummy region and is not provided in a central region of the overlap region or in a second region of the dummy region, the edge region being a region located at each of edges in a longitudinal direction of the electrode fingers in the overlap region, the overlap region being a region where the electrode fingers of the one of the pair of comb-shaped electrodes and the electrode fingers of the another of the pair of comb-shaped electrodes overlap, the first region being a region where the first portions of the dummy electrode fingers are located in the dummy region, the dummy region being a region where the dummy electrode fingers are located, the central region being a region located further in than the edge region in the overlap region, the second region being a region where the second portions of the dummy electrode fingers are located in the dummy region.

In another aspect of the present disclosure, there is provided an acoustic wave resonator including: a piezoelectric substrate; a pair of comb-shaped electrodes provided on the piezoelectric substrate, each of the pair of comb-shaped electrodes including electrode fingers, dummy electrode fingers, and a bus bar to which the electrode fingers and the dummy electrode fingers are connected, first tips of the electrode fingers of one of the pair of comb-shaped electrodes and second tips of the dummy electrode fingers of another of the pair of comb-shaped electrodes facing each other, an acoustic wave propagating through a first region of a dummy region being equal to an acoustic wave propagating through a second region of the dummy region, the dummy region being a region where the electrode fingers are located, the first region being a region located closer to an overlap region in the dummy region, the overlap region being a region where the electrode fingers of one of the pair of comb-shaped electrodes and the electrode fingers of the another of the pair of comb-shaped electrodes overlap, the second region being a region located at an opposite side of the overlap region across the first region in the dummy region; and an insulating film that is provided on the piezoelectric substrate from an edge region of the overlap region to the first region of the dummy region, and is not provided in a central region of the overlap region or in the second region of the dummy region, the edge region being a region located at each of edges in a longitudinal direction of the electrode fingers in the overlap region, the central region being a region located further in than the edge region in the overlap region.

In another aspect of the present disclosure, there is provided a filter including the above acoustic wave resonator.

In another aspect of the present disclosure, there is provided a multiplexer including the above filter.

DETAILED DESCRIPTION

Hereinafter, embodiments of the present disclosure will be described with reference to the drawings.

First Embodiment

Figure 1A:
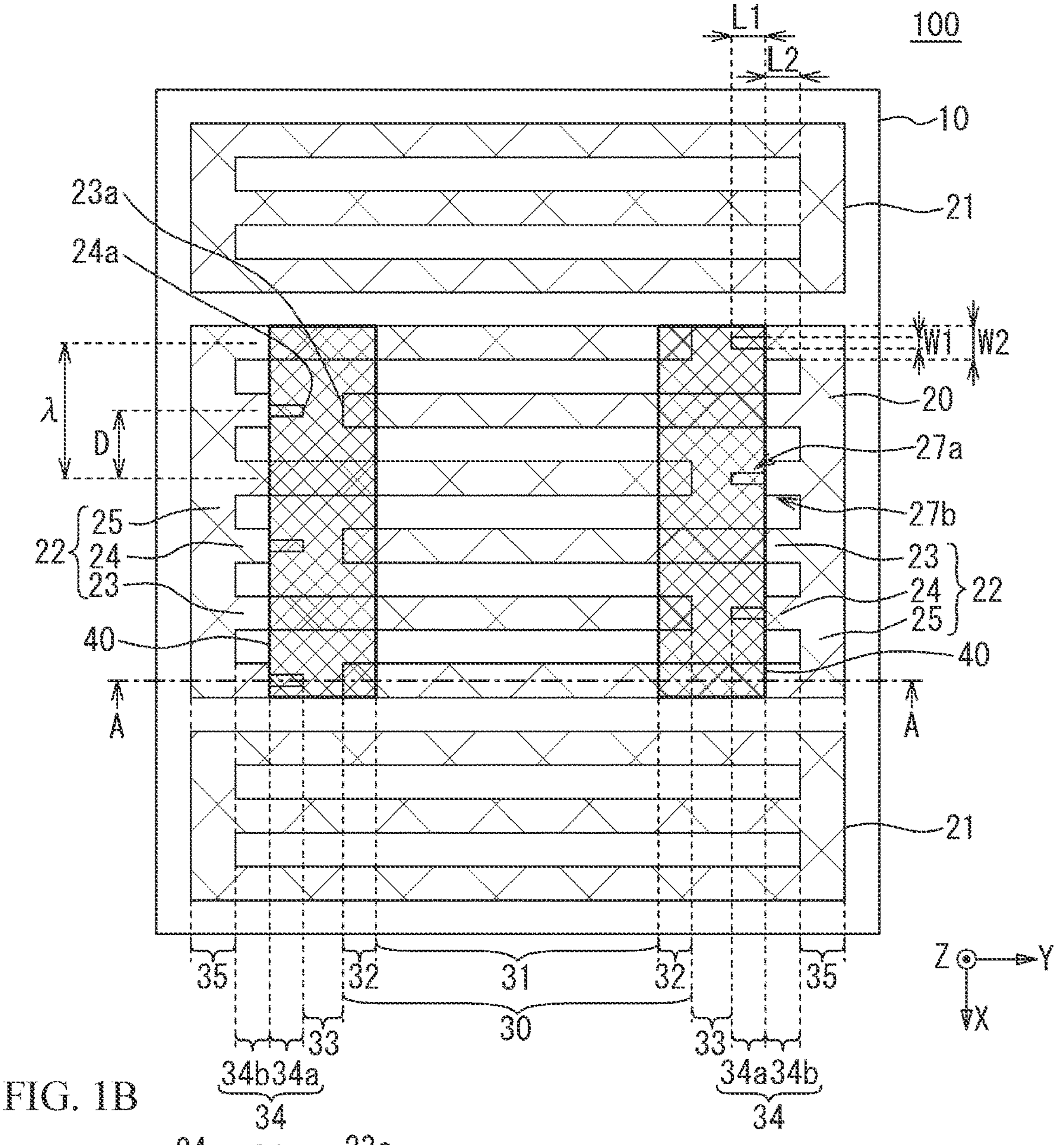
FIG. 1A is a plan view of an acoustic wave resonator in accordance with a first embodiment.
Figure 1B:
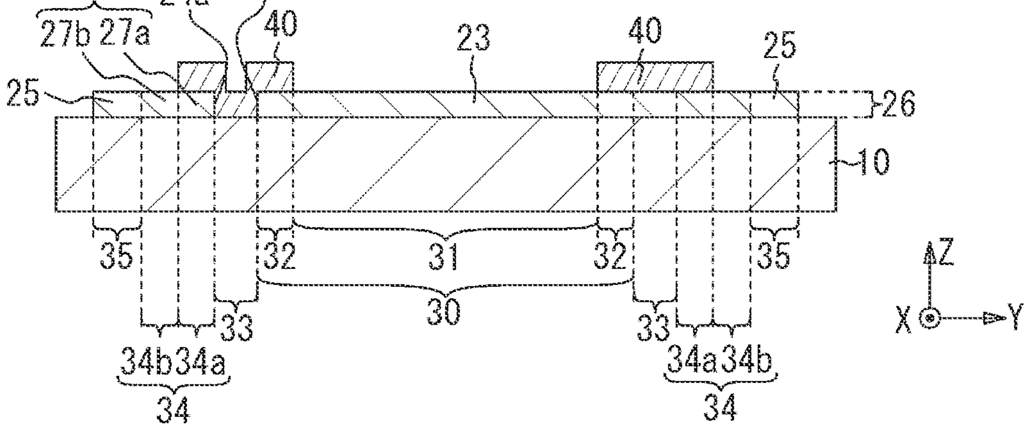
FIG. 1B is a cross-sectional view taken along line A-A in FIG. 1A.

FIG. 1A is a plan view of an acoustic wave resonator 100 in accordance with a first embodiment, and FIG. 1B is a cross-sectional view taken along line A-A in FIG. 1A. The direction in which electrode fingers 23 are arranged (the arrangement direction) is defined as an X direction, the longitudinal direction of the electrode fingers 23 is defined as a Y direction, and the thickness direction of a piezoelectric substrate 10 is defined as a Z direction. The X direction, the Y direction, and the Z direction do not necessarily correspond to the X-axis orientation and the Y-axis orientation of the crystal orientations of the piezoelectric substrate 10. When the piezoelectric substrate 10 is a rotated Y-cut X-propagation piezoelectric substrate, the X direction is the X-axis orientation of the crystal orientations.

As illustrated in FIG. 1A and FIG. 1B, the acoustic wave resonator 100 includes an interdigital transducer (IDT) 20 and reflectors 21 on the piezoelectric substrate 10. The IDT 20 and the reflectors 21 are formed of a metal film 26 on the piezoelectric substrate 10.

The IDT 20 includes a pair of comb-shaped electrodes 22. Each of the comb-shaped electrodes 22 includes the electrode fingers 23, dummy electrode fingers 24, and a bus bar 25 to which the electrode fingers 23 and the dummy electrode fingers 24 are connected. The thickness of the electrode finger 23 and the thickness of the dummy electrode finger 24 are equal. The term "thicknesses are equal" means that a difference of about a manufacturing error is acceptable, and one of the thicknesses is, for example, equal to or greater than 0.95 times and equal to or less than 1.05 times the other of the thicknesses. Tips 23*a* of the electrode fingers 23 of one of the comb-shaped electrodes 22 and tips 24*a* of the dummy electrode fingers 24 of the other of the comb-shaped electrodes 22 face each other. A region where the electrode fingers 23 of one of the comb-shaped electrodes 22 overlap the electrode fingers 23 of the other of the comb-shaped electrodes 22 is an overlap region 30. The length of the overlap region 30 in the Y direction is the aperture length. The pair of the comb-shaped electrodes 22 face each other so that the electrode fingers 23 of one of the comb-shaped electrodes 22 and the electrode fingers 23 of the other of the comb-shaped electrodes 22 are substantially alternately arranged in at least a part of the overlap region 30. An acoustic wave (surface acoustic wave) of the main mode excited by the electrode fingers 23 in the overlap region 30 propagates mainly in the X direction. The pitch of the electrode fingers 23 of one of the comb-shaped electrodes 22 is substantially equal to the wavelength λ of the surface acoustic wave. The pitch D of the electrode fingers 23 is approximately twice the pitch of the electrode fingers 23 of one of the comb-shaped electrodes 22. The reflectors 21 reflect the surface acoustic wave excited by the electrode fingers 23 of the IDT 20. Therefore, the surface acoustic wave is confined within the overlap region 30 of the IDT 20.

The overlap region 30 includes edge regions 32, which are regions located at respective edges in the Y direction, and a central region 31, which is a region located further in than the edge regions 32 in the Y direction. It can also be said that each of the edge regions 32 is a region where the tip portions of the electrode fingers 23 of the corresponding one of the comb-shaped electrodes 22 are located in the overlap region 30. A region located between the tips of the electrode fingers 23 of one of the comb-shaped electrodes 22 and the tips of the dummy electrode fingers 24 of the other of the comb-shaped electrodes 22 is a gap region 33. A region where the dummy electrode fingers 24 are located is a dummy region 34. A region where the bus bar 25 is located is a bus bar region 35. In the dummy region 34, a region located at the side of the gap region 33 is referred to as a region 34*a*, and a region located at the side of the bus bar region 35 is referred to as a region 34*b*.

Each of the dummy electrode fingers 24 includes a portion 27*a* located on the tip 24*a* side and located in the region 34*a*, and a portion 27*b* located at the opposite side of the tip 24*a* across the portion 27*a* and located in the region 34*b*. In each of the dummy electrode fingers 24, the width W1 of the portion 27*a* in the X direction is less than the width W2 of the portion 27*b* in the X direction. For example, the width W2 of the portion 27*b* in the X direction and the width of the electrode finger 23 in the X direction are equal. The term "widths are equal" means that a difference of about a manufacturing error is acceptable, and one the widths is, for example, equal to or greater than 0.95 times and equal to or less than 1.05 times the other of the widths. The width W1 of the portion 27*a* is, for example, equal to or less than 0.8 times the width W2 of the portion 27*b*. Alternatively, the width W1 of the portion 27*a* may be equal to or less than 0.7 times the width W2 of the portion 27*b*, or may be equal to or less than 0.6 times the width W2 of the portion 27*b*. In the dummy electrode finger 24, the length L1 of the portion 27*a* in the Y direction is longer than the length L2 of the portion 27*b* in the Y direction. However, the length L1 of the portion 27*a* in the Y direction may be equal to or shorter than the length L2 of the portion 27*b* in the Y direction.

An insulating film 40 is provided on the piezoelectric substrate 10 from each of the edge regions 32 to the region 34*a* of the corresponding dummy region 34 through the corresponding gap region 33. The insulating film 40 covers the electrode fingers 23 located in the edge region 32 and the gap region 33 and the electrode fingers 23 and the dummy electrode fingers 24 located in the region 34*a* of the dummy region 34. The insulating film 40 is also provided in portions where the electrode fingers 23 and the dummy electrode finger 24 are not provided in the edge region 32, the gap region 33, and the region 34*a* of the dummy region 34. No insulating film 40 is provided in the central region 31, the regions 34*b* of the dummy regions 34, and the bus bar regions 35.

The piezoelectric substrate 10 is, for example, a monocrystalline lithium tantalate ($LiTaO_3$) substrate or a monocrystalline lithium niobate ($LiNbO_3$) substrate, and is, for example, a rotated Y-cut X-propagation lithium tantalate substrate or a rotated Y-cut X-propagation lithium niobate substrate. As an example, the piezoelectric substrate 10 is a 36° to 48° Y-cut X-propagation lithium tantalate substrate.

The metal film 26 is a film containing, for example, aluminum (Al), copper (Cu), molybdenum (Mo), iridium (Ir), platinum (Pt), rhenium (Re), rhodium (Rh), ruthenium (Ru), tantalum (Ta), or tungsten (W) as a main component. An adhesion film such as a titanium (Ti) film or a chromium (Cr) film may be provided between the piezoelectric substrate 10 and the electrode fingers 23, the dummy electrode fingers 24, and the bus bars 25. The adhesion film is thinner than the electrode fingers 23, the dummy electrode fingers 24, and the bus bars 25. An insulating film may be provided so as to cover the electrode fingers 23 and the dummy electrode fingers 24. In this case, the insulating film 40 may be provided on the insulating film. The insulating film may function as a protective film.

The insulating film 40 is a film containing, for example, silicon oxide ($SiO_2$), tantalum oxide ($Ta_2O_5$), or niobium oxide ($Nb_2O_5$) as a main component, but may be a film containing other materials as a main component as long as the acoustic velocities of the acoustic wave propagating through the edge region 32, the acoustic wave propagating through the gap region 33, and the acoustic wave propagating through the region 34*a* of the dummy region 34 can be adjusted.

Here, when a film contains a certain element as its main component, this means that the film may contain an intentional or unintentional impurity other than the main component. When a certain element is a main component in a certain film, the concentration of the certain element is, for example, 50 atomic % or greater, or for example, 80 atomic % or greater. In the case of silicon oxide or the like containing two elements as main components, the total of the concentration of silicon and the concentration of oxygen is, for example, 50 atomic % or greater, or, for example, 80 atomic % or greater, and each of the concentration of silicon and the concentration of oxygen is, for example, 10 atomic % or greater.

Figure 2A:
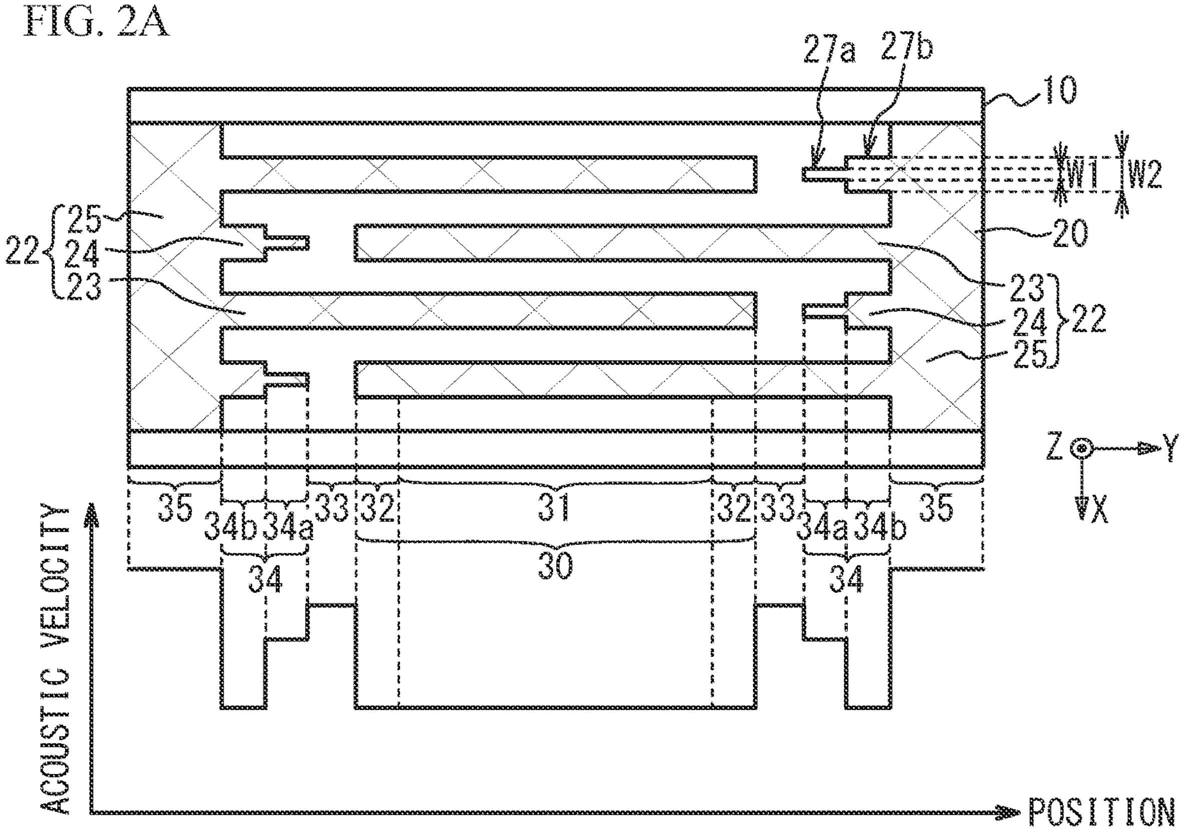
FIG. 2A and FIG. 2B each illustrates acoustic velocities of an acoustic wave in the first embodiment.
Figure 2B:
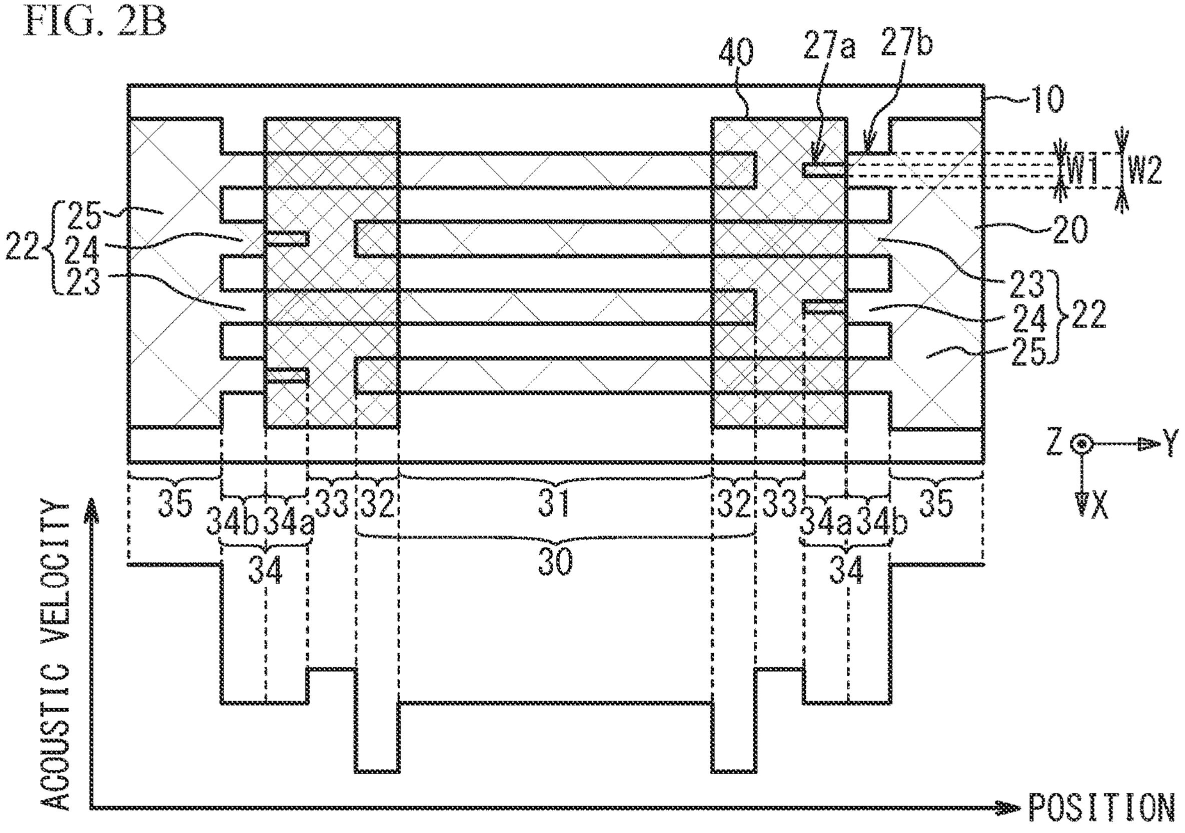

FIG. 2A and FIG. 2B each illustrates acoustic velocities of the acoustic wave in the first embodiment. FIG. 2A illustrates the acoustic velocities before the insulating film 40 is provided, and FIG. 2B illustrates the acoustic velocities after the insulating film 40 is provided. As illustrated in FIG. 2A, since the width W1 of the portion 27*a* of each of the dummy electrode fingers 24 is less than the width W2 of the portion 27*b*, the acoustic velocity of the surface acoustic wave propagating through the region 34*a* of the dummy region 34 is higher than the acoustic velocity of the surface acoustic wave propagating through the region 34*b*.

As illustrated in FIG. 2B, when the insulating film 40 is provided from the edge region 32 to the region 34*a* of the dummy region 34 through the gap region 33, the acoustic velocities of the surface acoustic wave propagating through the edge region 32, the surface acoustic wave propagating through the gap region 33, and the surface acoustic wave propagating through the region 34*a* of the dummy region 34 become lower than those before the insulating film 40 is provided, respectively. As a result, the acoustic velocity of the surface acoustic wave propagating through the region 34*a* of the dummy region 34 becomes close to, preferably equal to, the acoustic velocity of the surface acoustic wave propagating through the region 34*b*. As described above, the width W1 of the portion 27*a* of the dummy electrode finger 24 is narrowed so that the acoustic velocity of the surface acoustic wave propagating through the region 34*a* of the dummy region 34 becomes close to, preferably equal to, the acoustic velocity of the surface acoustic wave propagating through the region 34*b* after the insulating film 40 is provided.

When the acoustic velocity of the surface acoustic wave propagating through the region 34*a* of the dummy region 34 approaches the acoustic velocity of the surface acoustic wave propagating through the region 34*b*, the difference between the acoustic velocity of the surface acoustic wave propagating through each of the regions 34*a* and 34*b* of the dummy region 34 and the acoustic velocity of the surface acoustic wave propagating through the central region 31 can be reduced, or preferably the acoustic velocity of the surface acoustic wave propagating through each of the regions 34*a* and 34*b* of the dummy region 34 can be made to be equal to the acoustic velocity of the surface acoustic wave propagating through the central region 31. When the insulating film 40 is provided, the acoustic velocity of the surface acoustic wave propagating through the edge region 32 becomes lower than the acoustic velocity of the surface acoustic wave propagating through the central region 31. For example, the acoustic velocity of the surface acoustic wave propagating through the central region 31 is higher than 1.01 times and lower than 1.035 times the acoustic velocity of the surface acoustic wave propagating through the edge region 32. Even after the insulating film 40 is provided, the acoustic velocity of the surface acoustic wave propagating through the gap region 33 remains higher than the acoustic velocity of the surface acoustic wave propagating through the central region 31. For example, the acoustic velocity of the surface acoustic wave propagating through the gap region 33 is higher than 1.01 times and lower than 1.035 times the acoustic velocity of the surface acoustic wave propagating through the central region 31.

Manufacturing Method

A method of manufacturing the acoustic wave resonator 100 in accordance with the first embodiment will be described. First, the metal film 26 is formed on the piezoelectric substrate 10, and then the metal film 26 is patterned into a desired shape. As a result, on the piezoelectric substrate 10, the reflectors 21 and the IDT 20 including a pair of the comb-shaped electrodes 22 each including the electrode fingers 23, the dummy electrode fingers 24, and the bus bar 25 are formed. Each of the dummy electrode fingers 24 includes the portion 27*a* with a narrow width and the portion 27*b* that is wider than the portion 27*a* and has a width equal to the width of the electrode finger 23. A gap is formed between the tip of the electrode finger 23 and the tip of the dummy electrode finger 24. The metal film 26 is formed by, for example, sputtering, vacuum evaporation, or chemical vapor deposition (CVD). The metal film 26 is patterned using, for example, a photolithography method and an etching method.

Then, the insulating film 40 is formed so as to cover the electrode fingers 23 and the dummy electrode fingers 24 from the edge region 32 to the region 34*a* of the dummy region 34 through the gap region 33. The insulating film 40 is formed by, for example, forming a mask layer having an opening from the edge region 32 to the region 34*a* of the dummy region 34 through the gap region 33 on the piezoelectric substrate 10, then forming the insulating film 40 using the mask layer as a mask, and then removing the mask layer. For example, a photoresist is used as the mask layer. The insulating film 40 is formed by, for example, sputtering, vacuum evaporation, or CVD. Through the above steps, the acoustic wave resonator 100 of the first embodiment is formed.

Comparative Example

Figure 3A:
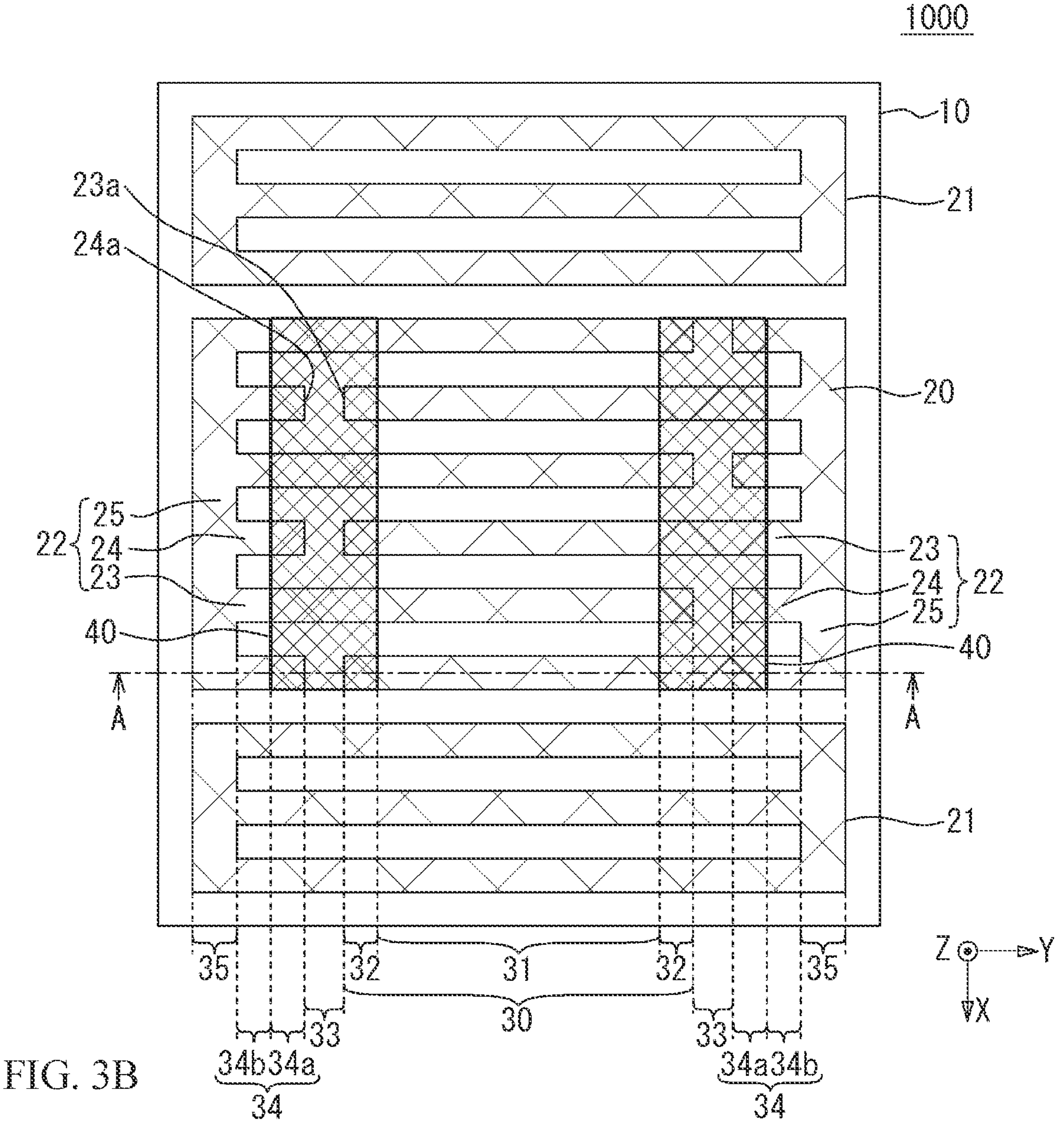
FIG. 3A is a plan view of an acoustic wave resonator in accordance with a comparative example.
Figure 3B:
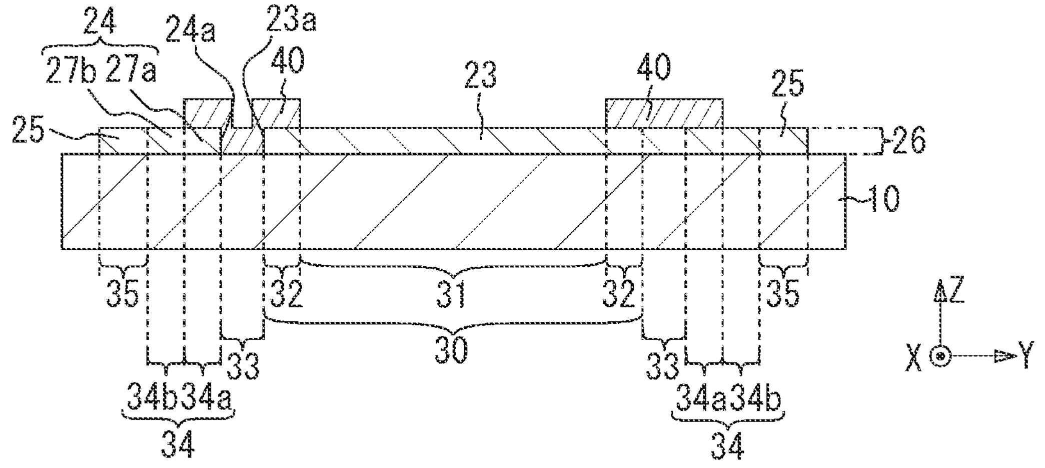
FIG. 3B is a cross-sectional view taken along line A-A in FIG. 3A.

FIG. 3A is a plan view of an acoustic wave resonator 1000 in accordance with a comparative example, and FIG. 3B is a cross-sectional view taken along line A-A in FIG. 3A. As illustrated in FIG. 3A and FIG. 3B, in the acoustic wave resonator 1000 of the comparative example, the width of the dummy electrode finger 24 in the X direction is substantially constant in the Y direction. Therefore, the width of the dummy electrode finger 24 in the X direction is the same between a portion where the insulating film 40 is provided and a portion where the insulating film 40 is not provided. Other configurations are the same as those of the first embodiment, and thus description thereof will be omitted.

Figure 4A:
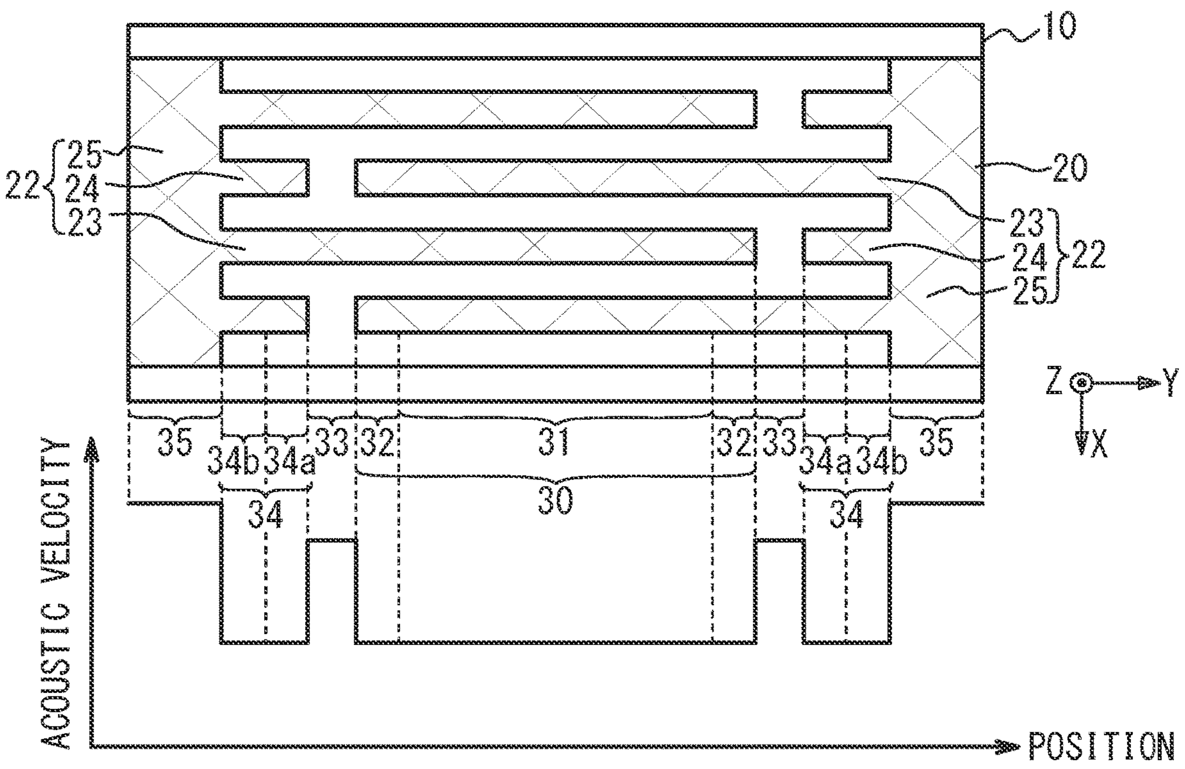
FIG. 4A and FIG. 4B each illustrates acoustic velocities of an acoustic wave in the comparative example.
Figure 4B:
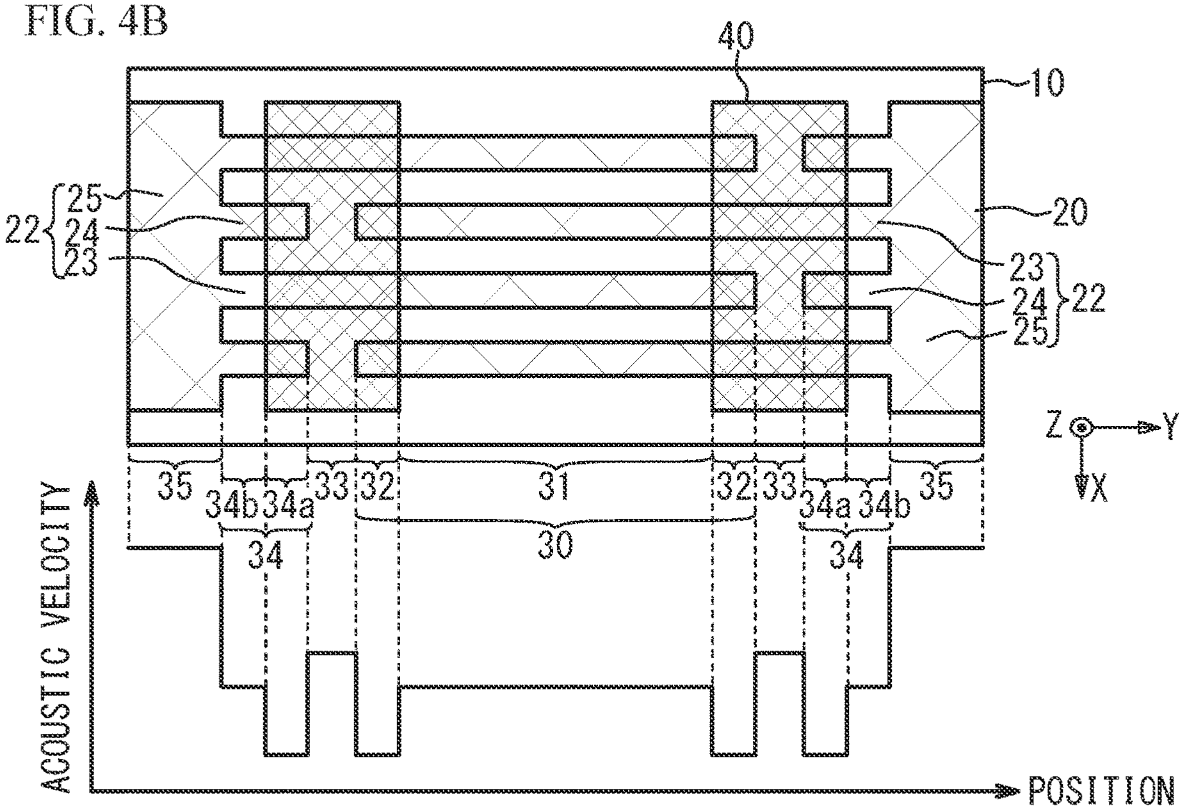

FIG. 4A and FIG. 4B each illustrates acoustic velocities of the acoustic wave in the comparative example. FIG. 4A illustrates the acoustic velocities before the insulating film 40 is provided, and FIG. 4B illustrates the acoustic velocities after the insulating film 40 is provided. As illustrated in FIG. 4A, since the width of the dummy electrode finger 24 in the X-direction is substantially constant in the Y-direction, the acoustic velocity of the surface acoustic wave propagating through the region 34*a* of the dummy region 34 is equal to the acoustic velocity of the surface acoustic wave propagating through the region 34*b*.

As illustrated in FIG. 4B, when the insulating film 40 is provided from the edge region 32 to the region 34*a* of the dummy region 34 through the gap region 33, the acoustic velocity of the surface acoustic wave propagating through the region 34*a* of the dummy region 34 becomes lower than the acoustic velocity of the surface acoustic wave propagating through the region 34*b*. The acoustic velocity of the surface acoustic wave propagating through the edge region 32 becomes lower than the acoustic velocity of the surface acoustic wave propagating through the central region 31. Even after the insulating film 40 is provided, the acoustic velocity of the surface acoustic wave propagating through the gap region 33 remains higher than the acoustic velocity of the surface acoustic wave propagating through the central region 31.

The piston mode can be achieved by providing the insulating film 40 in the edge region 32 so that the acoustic velocity of the surface acoustic wave propagating through the edge region 32 becomes lower than the acoustic velocity of the surface acoustic wave propagating through the central region 31. However, the length of the edge region 32 in the Y direction decreases as the frequency increases, and the length of the gap region 33 in the Y direction is equal to or less than the wavelength λ in order to obtain good characteristics. For this reason, when the insulating film 40 is provided in the edge region 32, the insulating film 40 may be formed from the edge region 32 to the region 34*a* of the dummy region 34 through the gap region 33 because of the minimum manufacturable size of the insulating film 40. When the insulating film 40 is formed in the region 34*a*, as illustrated in FIG. 4B, the acoustic velocity of the surface acoustic wave propagating through the region 34*a* becomes lower than the acoustic velocities of the surface acoustic wave propagating through the region 34*b* and the surface acoustic wave propagating through the central region 31.

To reduce lateral-mode spurious emissions, the acoustic velocity of the surface acoustic wave propagating through the dummy region 34 is preferably equal to the acoustic velocity of the surface acoustic wave propagating through the central region 31. However, if the insulating film 40 for achieving the piston mode is provided in the region 34*a* of the dummy region 34, the acoustic velocity of the surface acoustic wave propagating through the region 34*a* becomes lower than the acoustic velocity of the surface acoustic wave propagating through the region 34*b* and the surface acoustic wave propagating through the central region 31, and the effect of reducing lateral-mode spurious emissions is reduced.

Simulation

A simulation was performed to evaluate spurious emissions of the acoustic wave resonators in accordance with the first embodiment and the comparative example. The simulation for the acoustic wave resonator in accordance with the comparative example was performed on samples 1 and 2 having different lengths of the insulating film 40 covering the dummy region 34. The simulation conditions are as follows.

Common Conditions

- Piezoelectric substrate 10: 42° Y-cut X-propagation lithium tantalate substrate
- IDT 20 and the reflectors 21: Aluminum film with a thickness of 220 nm
- Insulating film 40: Niobium oxide film with a thickness of 16 nm
- Anisotropy coefficient of the piezoelectric substrate 10: 0.3
- Wavelength λ of the acoustic wave: 2.2 μm
- Duty ratio of the electrode finger 23: 50%
- Length of the edge region 32 in the Y direction: 0.3λ
- Length of the gap region 33 in the Y direction: 500 nm
- Length of the dummy electrode finger 24 in the Y direction: 1.5λ

Conditions of First Embodiment

- Length of the portion 27*a* of the dummy electrode finger 24 in the Y direction: 1.3λ
- Duty ratio of the portion 27*a* of the dummy electrode finger 24: 35%
- Length of the portion 27*b* of the dummy electrode finger 24 in the Y direction: 0.2λ
- Duty ratio of the portion 27*b* of the dummy electrode finger 24: 50%
- Difference between the acoustic velocities in the region 34*a* and the region 34*b* of the dummy region 34: 0%

Conditions of Sample 1 of Comparative Example

- Duty ratio of the dummy electrode finger 24: 50%
- Length in the Y direction of the region 34*a*, where the insulating film 40 covers the dummy electrode fingers 24, of the dummy region 34: 500 nm
- Difference between acoustic velocities in the region 34*a* and the region 34*b* of the dummy region 34: 1.47%

Conditions of Sample 2 of Comparative Example

- Duty ratio of the dummy electrode finger 24: 50%
- Length in the Y direction of the region 34*a*, where the insulating film 40 covers the dummy electrode fingers 24, of the dummy region 34: 700 nm
- Difference between acoustic velocities in the region 34*a* and the region 34*b* of the dummy region 34: 1.47%

Figure 5A:
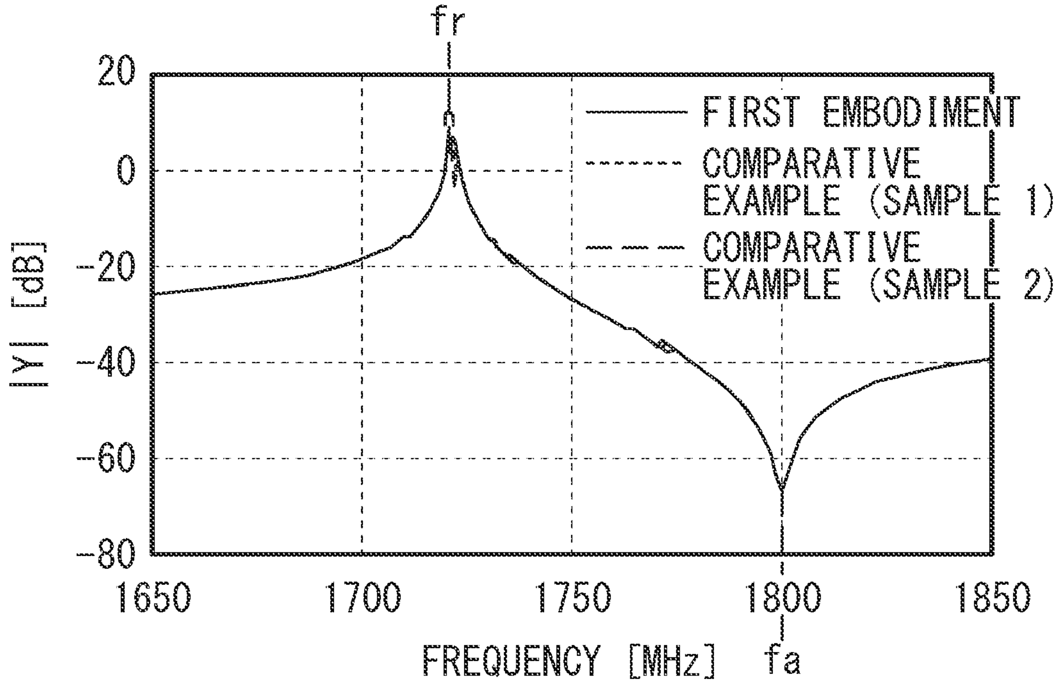
FIG. 5A presents simulation results of the absolute value |Y| of the admittance of each of the acoustic wave resonators in accordance with the first embodiment and the comparative example with respect to frequency.
Figure 5B:
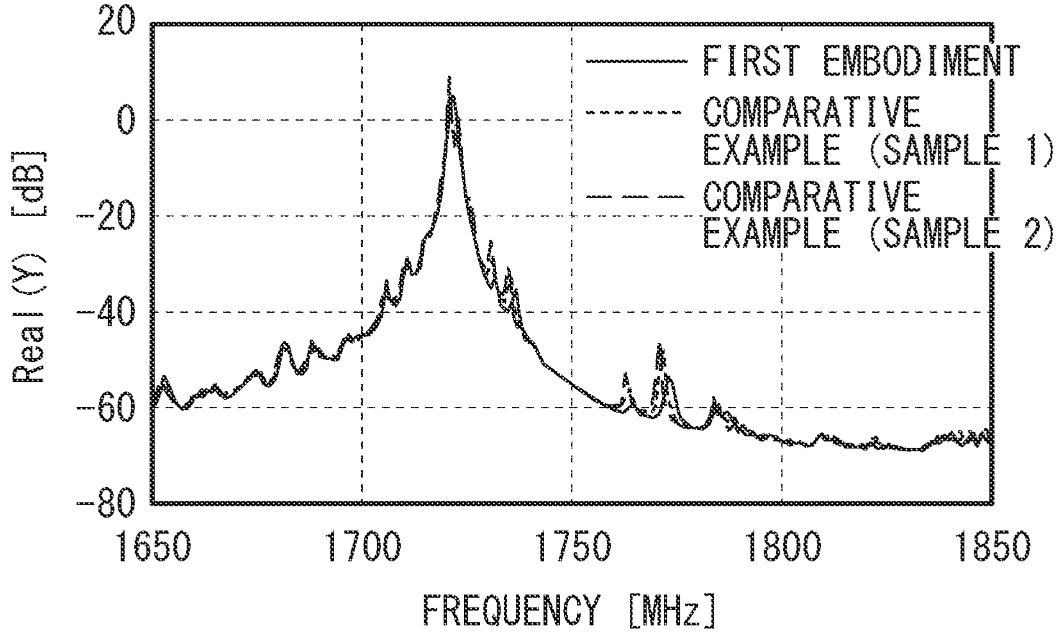
FIG. 5B presents simulation results of the real part Real(Y) of the admittance with respect to frequency.

FIG. 5A presents simulation results of the absolute value |Y| of the admittance of each of the acoustic wave resonators in accordance with the first embodiment and the comparative example with respect to the frequency, and FIG. 5B presents simulation results of the real part Real(Y) of the admittance with respect to the frequency. In the absolute value |Y| of the admittance, peaks of the resonant frequency fr and the antiresonant frequency fa are observed. A larger spurious response is observed in the real part Real(Y) of the admittance than in the absolute value |Y|.

As presented in FIG. 5A, for the resonance frequency fr and the anti-resonance frequency fa, there was almost no difference among the first embodiment and the samples 1 and 2 of the comparative example. As presented in FIG. 5B, the sample 2 of the comparative example had larger spurious emissions than the sample 1 of the comparative example. This reveals that the spurious emission increases as the area where the insulating film 40 covers the dummy region 34 increases and thereby, the region 34*a* where the acoustic wave velocity of the surface acoustic wave propagating therethrough is lower than the acoustic velocity of the surface acoustic wave propagating through the central region 31 in the dummy region 34 increases. In contrast, in the first embodiment, spurious emissions were reduced as compared with the samples 1 and 2 of the comparative example. This is considered to be because by reducing the width W1 of the portion 27*a* of each of the dummy electrode fingers 24, the acoustic velocity of the surface acoustic wave propagating through the region 34*a* of the dummy region 34 becomes equal to the acoustic velocities of the surface acoustic waves propagating through the region 34*b* and the surface acoustic waves propagating through the central region 31 when the insulating film 40 is formed to cover the portions 27*a* of the dummy electrode fingers 24.

Experiment

Acoustic wave resonators in accordance with the first embodiment and the comparative example were fabricated to conduct an experiment for evaluating spurious emissions. The experimental conditions are as follows.

Common Conditions

- Piezoelectric substrate 10: 42° Y-cut X-propagation lithium tantalate substrate
- IDT 20 and the reflectors 21: Multilayered film including a titanium film with a thickness of 10 nm and an aluminum film with a thickness of 135 nm
- Insulating film 40: Niobium oxide film with a thickness of 22 nm
- An anisotropy coefficient of the piezoelectric substrate 10: 0.1
- Wavelength λ of the acoustic wave: 2.2 μm
- Duty ratio of the electrode finger 23: 50%
- Length of the edge region 32 in the Y direction: 0.3λ
- Length of the gap region 33 in the Y direction: 500 nm
- Length of the dummy electrode finger 24 in the Y direction: 1.5λ

Conditions of First Embodiment

- Length of the portion 27*a* of the dummy electrode finger 24 in the Y direction: 1.3λ
- Duty ratio of the portion 27*a* of the dummy electrode finger 24: 35%
- Length of the portion 27*b* of the dummy electrode finger 24 in the Y direction: 0.2λ
- Duty ratio of the portion 27*b* of the dummy electrode finger 24: 50%
- Difference between acoustic velocities in the region 34*a* and the region 34*b* of the dummy region 34: 0%

Conditions of Comparative Example

- Duty ratio of the dummy electrode finger 24: 50%
- Length in the Y direction of the region 34*a*, where the insulating film 40 covers the dummy electrode fingers 24, of the dummy region 34: 1.3λ
- Difference between acoustic velocities in the region 34*a* and the region 34*b* of the dummy region 34: 1.47%

Figure 6A:
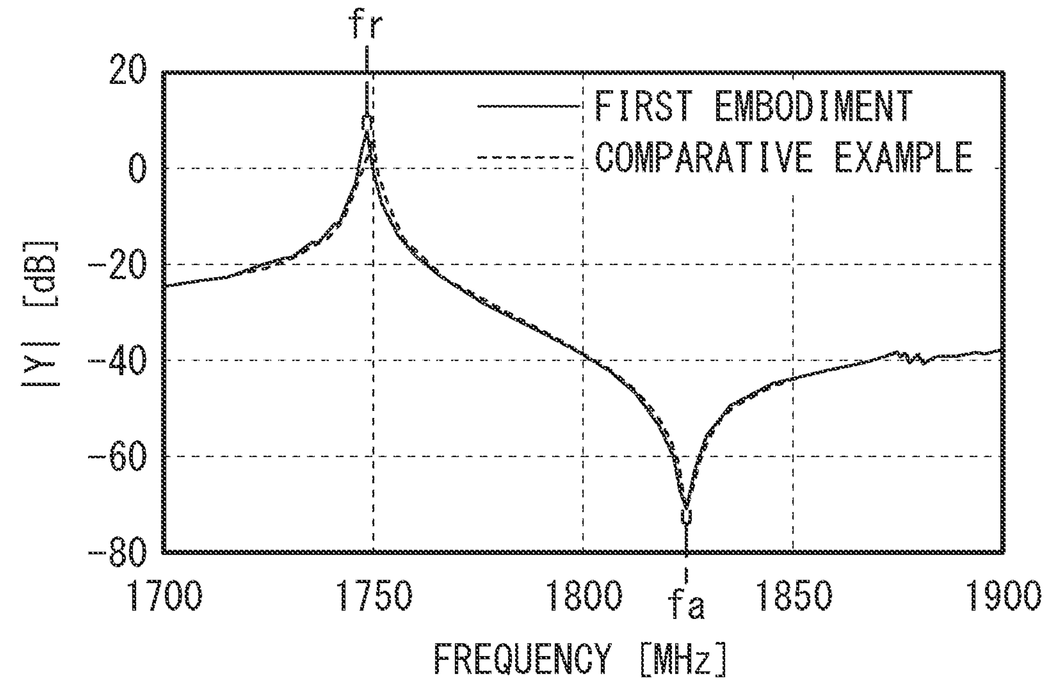
FIG. 6A presents experimental results of the absolute value |Y| of the admittance of each of the acoustic wave resonators in accordance with the first embodiment and the comparative example with respect to frequency.
Figure 6B:
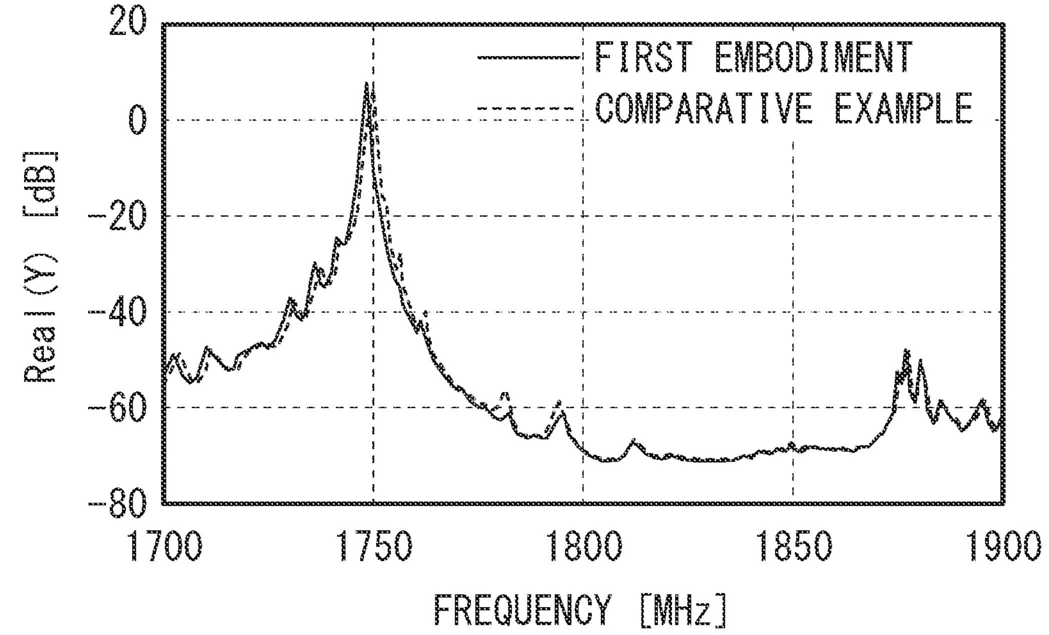
FIG. 6B is experimental results of the real part Real(Y) of the admittance with respect to frequency.

FIG. 6A presents experimental results of the absolute value |Y| of the admittance of each of the acoustic wave resonators in accordance with the first embodiment and the comparative example with respect to frequency, and FIG. 6B presents experimental results of the real part Real(Y) of the admittance with respect to frequency. As presented in FIG. 6A, for the resonant frequency fr and the antiresonant frequency fa, there was almost no difference between the first embodiment and the comparative example. As presented in FIG. 6B, the spurious emissions are reduced in the first embodiment as compared with the comparative example.

Variations of the First Embodiment

Figure 7A:
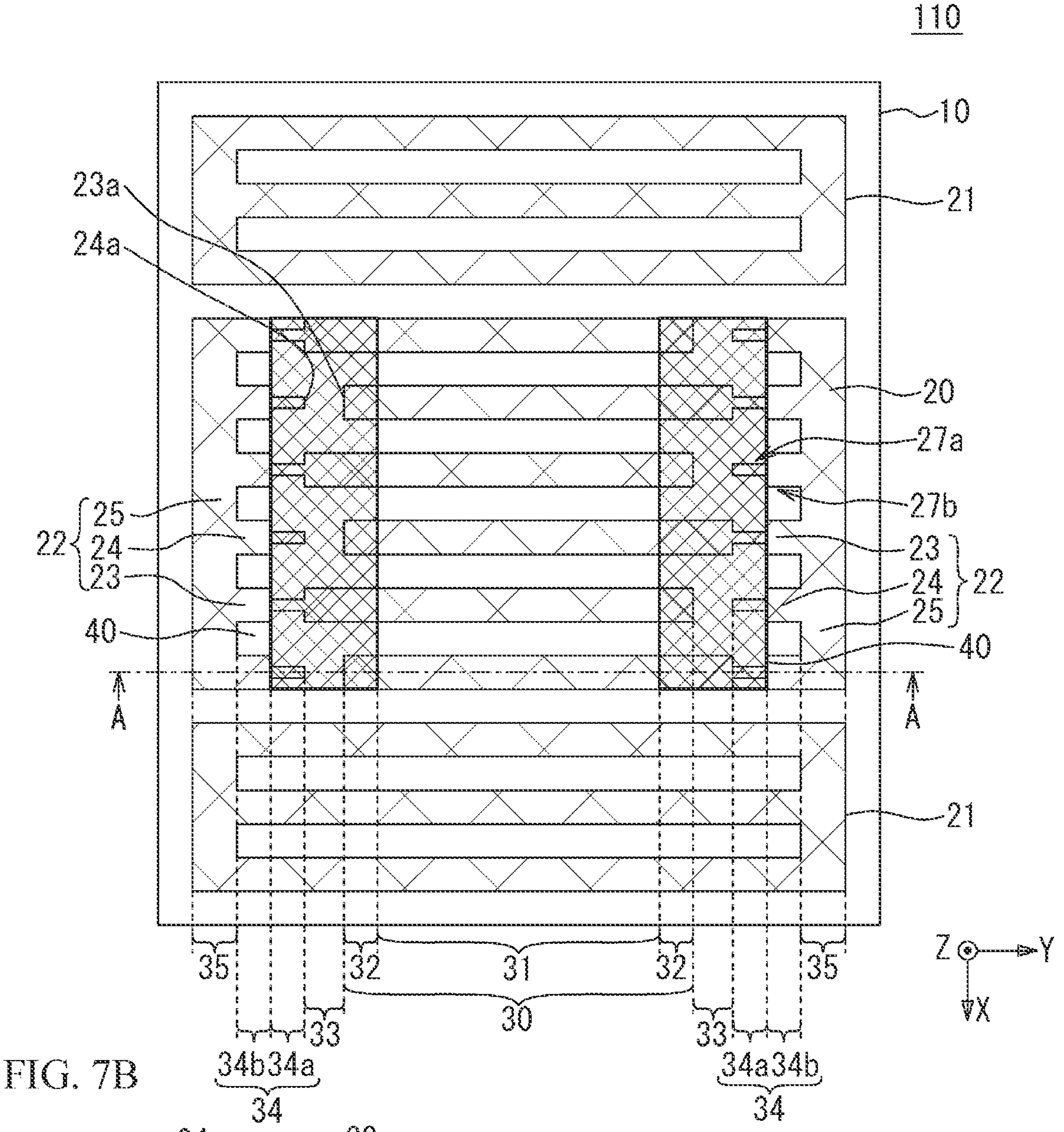
FIG. 7A is a plan view of an acoustic wave resonator in accordance with a first variation of the first embodiment.
Figure 7B:
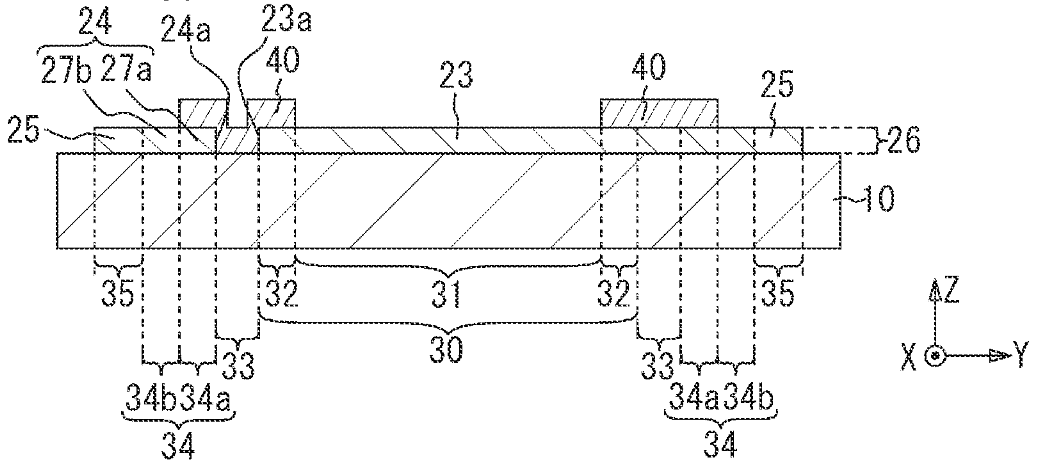
FIG. 7B is a cross-sectional view taken along line A-A in FIG. 7A.

FIG. 7A is a plan view of an acoustic wave resonator 110 in accordance with a first variation of the first embodiment, and FIG. 7B is a cross-sectional view taken along line A-A in FIG. 7A. As illustrated in FIG. 7A and FIG. 7B, in the acoustic wave resonator 110 in accordance with the first variation of the first embodiment, in addition to the widths of the dummy electrode fingers 24, the widths of the electrode fingers 23 are reduced in the region 34*a* of the dummy region 34. Other configurations are the same as those of the first embodiment, and thus description thereof will be omitted. As in the first variation, the width of the electrode finger 23 may be reduced in addition to the width of the dummy electrode finger 24.

Figure 8A:
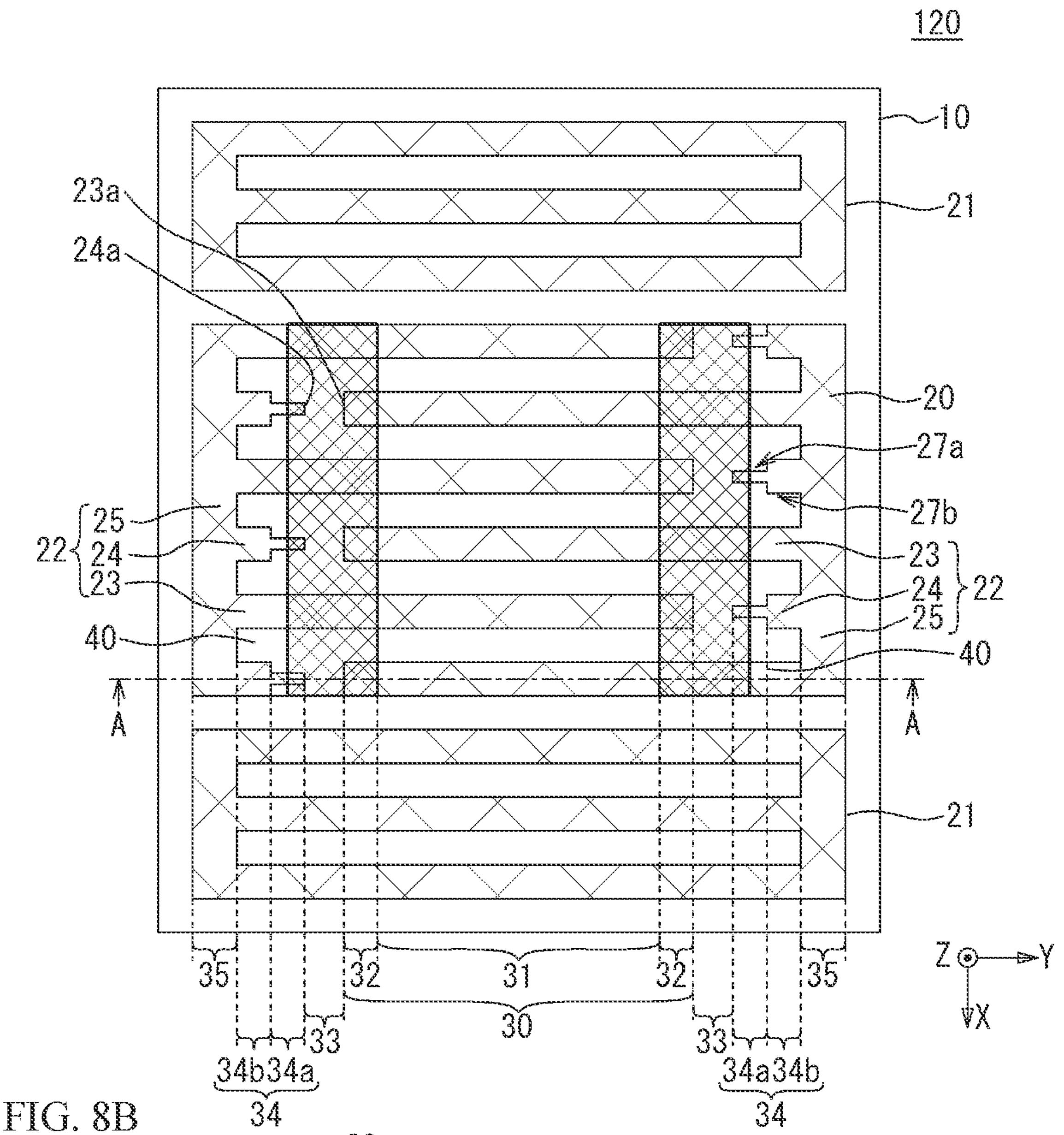
FIG. 8A is a plan view of an acoustic wave resonator in accordance with a second variation of the first embodiment.
Figure 8B:
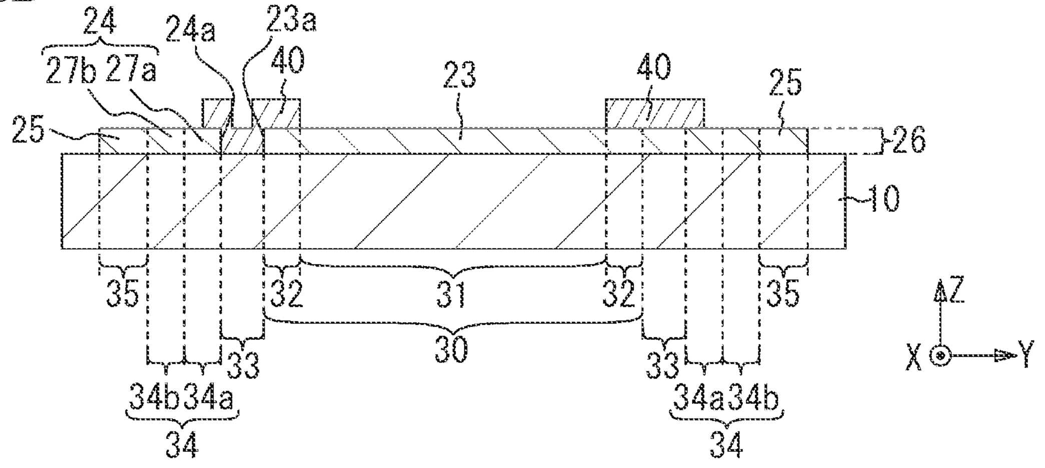
FIG. 8B is a cross-sectional view taken along line A-A in FIG. 8A.

FIG. 8A is a plan view of an acoustic wave resonator 120 in accordance with a second variation of the first embodiment, and FIG. 8B is a cross-sectional view taken along line A-A in FIG. 8A. In the acoustic wave resonator 100 of the first embodiment, as illustrated in FIG. 1A and FIG. 1B, the insulating film 40 is provided to cover the entire region 34*a* of the dummy region 34. On the other hand, in the acoustic wave resonator 120 of the second variation of the first embodiment, as illustrated in FIG. 8A and FIG. 8B, the insulating film 40 is provided to cover only a part of the region 34*a* of the dummy region 34.

As described above, in the first embodiment and the variations thereof, each of the dummy electrode fingers 24 includes the portion 27*a* located at the side of the tip 24*a* and the portion 27*b* located at the opposite side of the tip 24*a* across the portion 27*a*, and the portion 27*a* has a narrower width in the X direction (short-side direction) than the portion 27*b*. The insulating film 40 is provided on the piezoelectric substrate 10 from the edge region 32 to the region 34*a* where the portions 27*a* of the dummy electrode fingers 24 are located in the dummy region 34, and is not provided in the central region 31 or the region 34*b* where the portions 27*b* of the dummy electrode fingers 24 are located in the dummy region 34. Thus, as illustrated in FIG. 2B, the difference between the acoustic velocity of the surface acoustic wave propagating through the region 34*a* of the dummy region 34 and the acoustic velocity of the surface acoustic wave propagating through the region 34*b* can be reduced, and the difference between the acoustic velocity of the surface acoustic wave propagating through each of the regions 34*a* and 34*b* of the dummy region 34 and the acoustic velocity of the surface acoustic wave propagating through the central region 31 can be reduced. Therefore, lateral-mode spurious emissions can be reduced.

In order to achieve the piston mode, the length of the central region 31 in the Y direction and the length of the edge region 32 in the Y direction preferably satisfy a certain relationship. For example, the length of the central region 31 in the Y direction is preferably longer than the total length of the edge regions 32 in the Y direction. The length of each of the edge regions 32 in the Y direction is preferably 1λ, or less (for example, equal to or less than 1/20 of the aperture length), and more preferably 0.5λ or less (for example, equal to or less than 1/40 of the aperture length). The length of each of the edge regions 32 in the Y direction is preferably equal to or greater than 0.05λ (for example, equal to or greater than 1/400 of the aperture length), and more preferably equal to or greater than 0.1λ (for example, equal to or greater than 1/200 of the aperture length). The edge region 32 may be provided only on one side of the central region 31. The length of each of the gap regions 33 in the Y direction is preferably 2λ or less (for example, equal to or less than 1/10 of the aperture length), and more preferably 1λ or less (for example, equal to or less than 1/20 of the aperture length). The length of each of the gap regions 33 in the Y direction is preferably 0.1λ or greater (for example, equal to or greater than 1/200 of the aperture length), and more preferably 0.2λ or greater (for example, equal to or greater than 1/100 of the aperture length).

In the first embodiment and the first variation, as illustrated in FIG. 1A and FIG. 7A, the insulating film 40 is provided on the piezoelectric substrate 10 from the edge region 32 to the boundary between the regions 34*a* and 34*b* of the dummy region 34. In other words, the insulating film 40 is provided to cover the entire region 34*a* of the dummy region 34 in the Y direction. Thus, the acoustic velocity of the surface acoustic wave propagating through the region 34*a* of the dummy region 34 is likely to be equal to the acoustic velocity of the surface acoustic wave propagating through the region 34*b*. As a result, the acoustic velocity of the surface acoustic wave propagating through each of the regions 34*a* and 34*b* of the dummy region 34 is likely to be equal to the acoustic velocity of the surface acoustic wave propagating through the central region 31. Therefore, lateral-mode spurious emissions can be reduced.

As in the second variation of the first embodiment illustrated in FIG. 8A, the insulating film 40 may be omitted in a part of the region 34*a* of the dummy region 34. In this case, the insulating film 40 preferably covers 70% or greater, more preferably 80% or greater, and further preferably 90% or greater of the region 34*a* in the Y direction so as to increase the region through which the surface acoustic wave having an acoustic velocity equal to the acoustic velocity of the surface acoustic wave propagating through the central region 31 propagates in the dummy region 34.

In the first embodiment and the variations thereof, the width W2 of the portion 27*b* of the dummy electrode finger 24 in the X direction is equal to the width of the electrode finger 23 in the X direction. Thus, the acoustic velocity of the surface acoustic wave propagating through each of the regions 34*a* and 34*b* of the dummy regions 34 can be made to be equal to the acoustic velocity of the surface acoustic wave propagating through the central region 31. The term "the widths of the electrode fingers are equal" means that a difference of about manufacturing error is acceptable, and for example, the width of one electrode finger is equal to or greater than 0.95 times or equal to or less than 1.05 times the width of another electrode finger, and may be equal to or greater than 0.98 times and equal to or less than 1.02 times the width of another electrode finger.

In the first embodiment and the variations thereof, the acoustic velocity of the surface acoustic wave propagating through the region 34*a* of the dummy region 34 is equal to the acoustic velocity of the surface acoustic wave propagating through the region 34*b*. As a result, the acoustic velocity of the surface acoustic wave propagating through each of the regions 34*a* and 34*b* of the dummy region 34 is likely to be equal to the acoustic velocity of the surface acoustic wave propagating through the central region 31, and thus lateral-mode spurious emissions can be reduced. The term "the acoustic velocities are equal" means that a difference of about manufacturing error is acceptable, and for example, one of the acoustic velocities is equal to or greater than 0.98 times and equal to or less than 1.02 times the other one, and may be equal to or greater than 0.99 times and equal to or less than 1.01 times the other one. For example, when a 42°-rotated Y-cut X-propagation lithium tantalate substrate is used as the piezoelectric substrate 10 and the difference between the acoustic velocities in the dummy region 34 and the central region 31 is equal to or less than 160 (m/s), it can be said that the acoustic velocity in the dummy region 34 and the acoustic velocity in the central region 31 are equal.

In the first embodiment and the variations thereof, the acoustic velocity of the surface acoustic wave propagating through the region 34*a* of the dummy region 34, the acoustic velocity of the surface acoustic wave propagating through the region 34*b*, and the acoustic velocity of the surface acoustic wave propagating through the central region 31 are equal. This can reduce lateral-mode spurious emissions. The term "the acoustic velocities are equal" means that the acoustic velocity of the surface acoustic wave is equal to or greater than 0.98 times and equal to or less than 1.02 times the acoustic velocity of another surface acoustic wave, and may be equal to or greater than 0.985 times and equal to or less than 1.015 times the acoustic velocity of another surface acoustic wave, or may be equal to or greater than 0.99 times and equal to or less than 1.01 times the acoustic velocity of another surface acoustic wave.

In the first embodiment and the variations thereof, the length of the gap region 33 in the Y direction is equal to or less than twice the average pitch D of the electrode fingers 23 of the pair of the comb-shaped electrodes 22 (equal to or less than 1λ). In this case, since the insulating film 40 is likely to be formed from the edge region 32 to the dummy region 34 for manufacturing reasons, the widths W1 of the portions 27*a* of the dummy electrode fingers 24 are preferably reduced. For this reason, when the length of the gap region 33 in the Y direction is equal to or less than 1.5 times the average pitch D of the electrode fingers 23 (equal to or less than 0.75λ), the widths W1 of the portions 27*a* of the dummy electrode fingers 24 are preferably reduced. When the length of the gap region 33 in the Y direction is equal to or less than 1 time the average pitch D of the electrode fingers 23 (equal to or less than 0.5λ), the width W1 of the portion 27*a* of the dummy electrode finger 24 is more preferably reduced. The average pitch D of the electrode fingers 23 can be calculated by dividing the length of the IDT 20 in the X direction by the number of the electrode fingers 23.

Second Embodiment

Figure 9A:
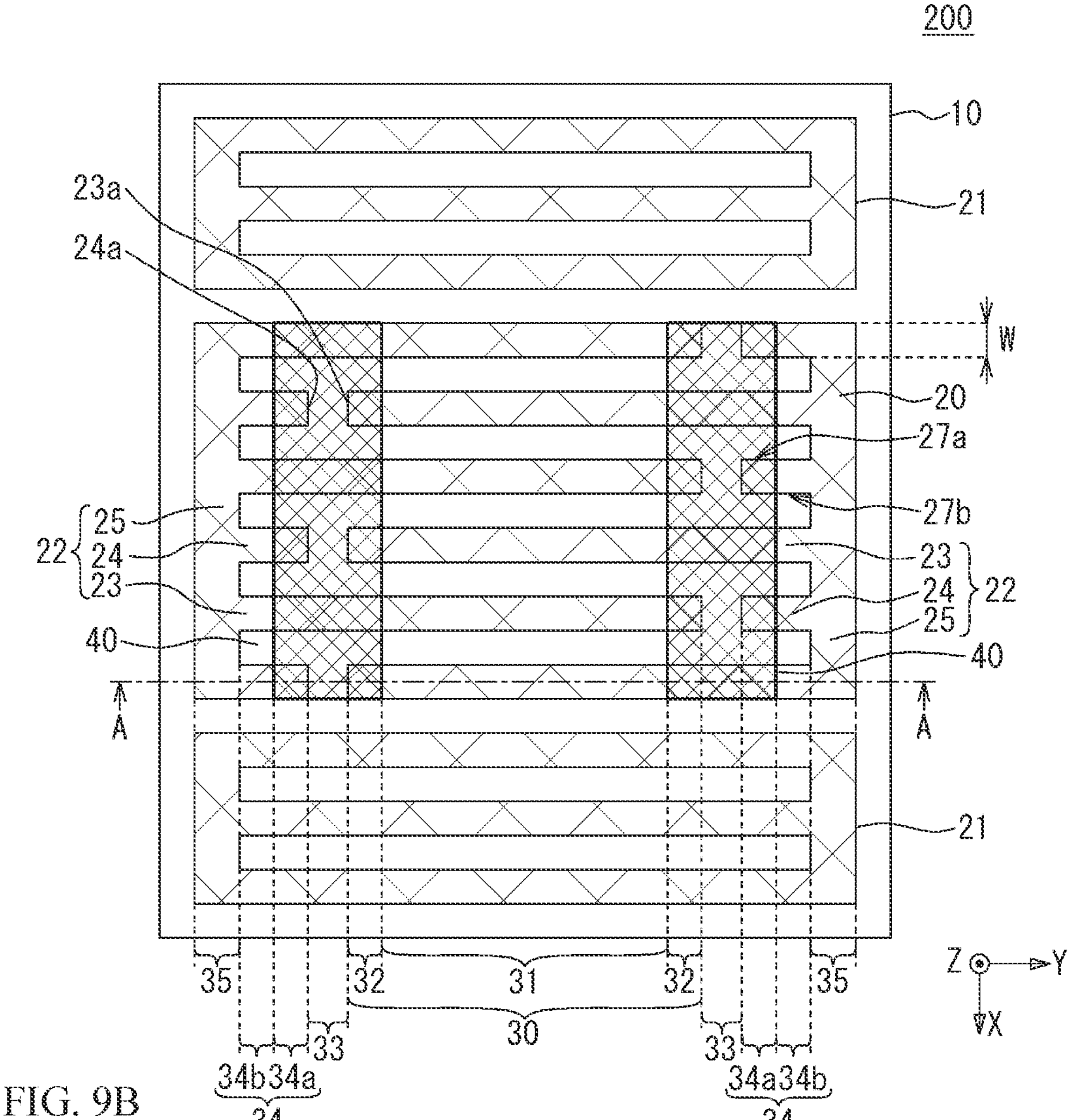
FIG. 9A is a plan view of an acoustic wave resonator in accordance with a second embodiment.
Figure 9B:
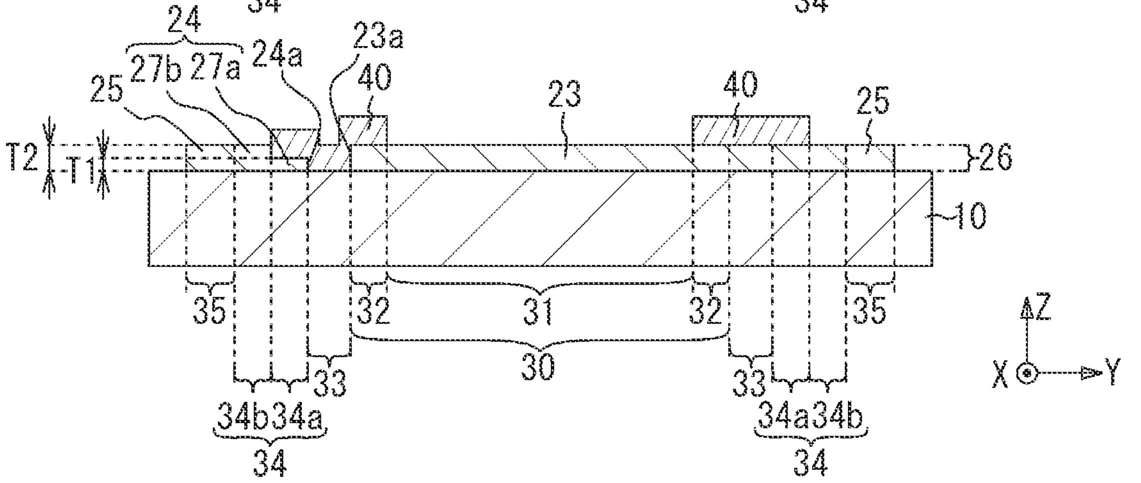
FIG. 9B is a cross-sectional view taken along line A-A in FIG. 9A.

FIG. 9A is a plan view of an acoustic wave resonator 200 in accordance with a second embodiment, and FIG. 9B is a cross-sectional view taken along line A-A in FIG. 9A. As illustrated in FIG. 9A and FIG. 9B, in the acoustic wave resonator 200 of the second embodiment, the widths W of the dummy electrode fingers 24 in the X direction are substantially constant in the Y direction and are equal to the widths of the electrode fingers 23 in the X direction, but the thicknesses T1 of the portions 27*a* located in the region 34*a* are thinner than the thicknesses T2 of the portions 27*b* located in the region 34*b*. The thicknesses T1 of the portions 27*a* of the dummy electrode fingers 24 are, for example, equal to or less than 0.8 times the thicknesses T2 of the portions 27*b*, and may be equal to or less than 0.7 times the thicknesses T2 of the portions 27*b*, or may be equal to or less than 0.6 times the thicknesses T2 of the portions 27*b*. The thicknesses T2 of the portions 27*b* of the dummy electrode fingers 24 are equal to the thicknesses of the electrode fingers 23. Since other configurations are equal to those of the first embodiment, description thereof will be omitted.

Figure 10A:
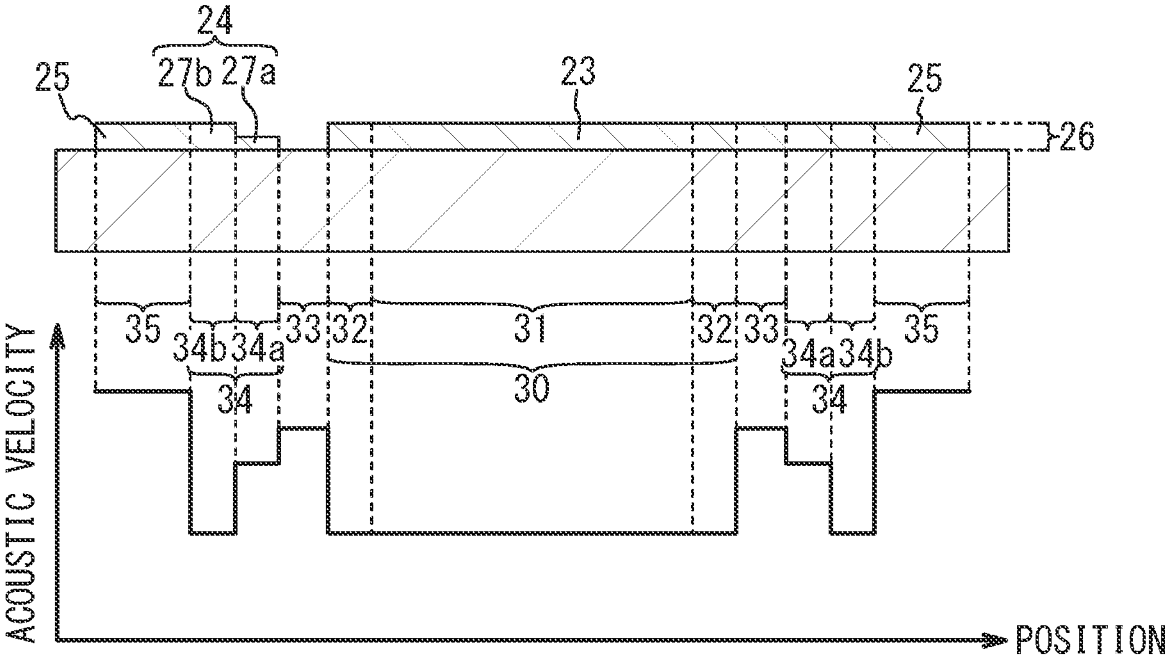
FIG. 10A and FIG. 10B each illustrates acoustic velocities of an acoustic wave in the second embodiment.
Figure 10B:
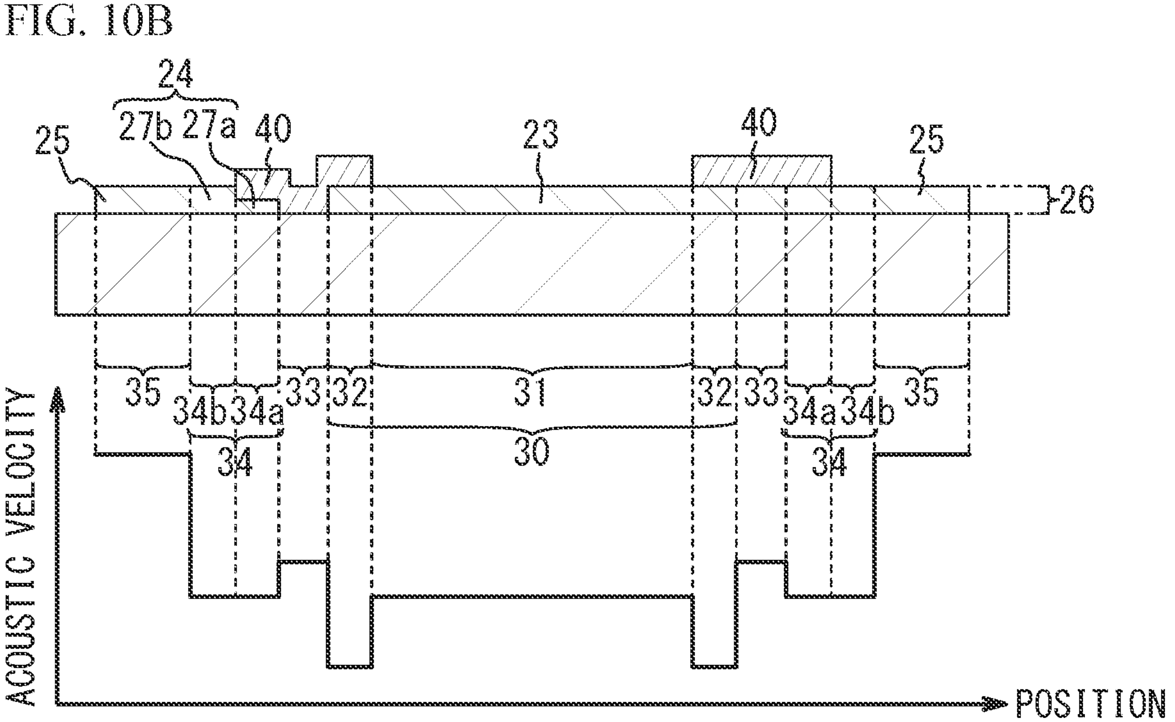

FIG. 10A and FIG. 10B each illustrates acoustic velocities of the acoustic wave in the second embodiment. FIG. 10A illustrates the acoustic velocities before the insulating film 40 is provided, and FIG. 10B illustrates the acoustic velocities after the insulating film 40 is provided. As illustrated in FIG. 10A, since the thickness T1 of the portion 27*a* of the dummy electrode finger 24 is less than the thickness T2 of the portion 27*b* of the dummy electrode fingers 24, the acoustic velocity of the surface acoustic wave propagating through the region 34*a* of the dummy region 34 is higher than the acoustic velocity of the surface acoustic wave propagating through the region 34*b* of the dummy region 34.

As illustrated in FIG. 10B, when the insulating film 40 is provided from the edge region 32 to the region 34*a* of the dummy region 34 through the gap region 33, the acoustic velocity of the surface acoustic wave propagating through the region 34*a* of the dummy region 34 becomes close to, preferably equal to, the acoustic velocity of the surface acoustic wave propagating through the region 34*b*. As described above, the thicknesses T1 of the portions 27*a* of the dummy electrode fingers 24 are reduced so that the acoustic velocity of the surface acoustic wave propagating through the region 34*a* of the dummy region 34 becomes close to (preferably equal to) the acoustic velocity of the surface acoustic wave propagating through the region 34*b* after the insulating film 40 is provided. When the acoustic velocity of the surface acoustic wave propagating through the region 34*a* of the dummy region 34 approaches the acoustic velocity of the surface acoustic wave propagating through the region 34*b*, the difference between the acoustic velocity of the surface acoustic wave propagating through each of the regions 34*a* and 34*b* of the dummy region 34 and the acoustic velocity of the surface acoustic wave propagating through the central region 31 can be reduced, and preferably the acoustic velocity of the surface acoustic wave propagating through each of the regions 34*a* and 34*b* of the dummy region 34 and the acoustic velocity of the surface acoustic wave propagating through the central region 31 can be made to be equal to each other. When the insulating film 40 is provided, the acoustic velocity of the surface acoustic wave propagating through the edge region 32 becomes lower than the acoustic velocity of the surface acoustic wave propagating through the central region 31. Even after the insulating film 40 is provided, the acoustic velocity of the surface acoustic wave propagating through the gap region 33 remains higher than the acoustic velocity of the surface acoustic wave propagating through the central region 31.

In the second embodiment, each of the dummy electrode fingers 24 includes the portion 27*a* located at the side of the tip 24*a* and the portion 27*b* located at the opposite side of the tip 24*a* across the portion 27*a*, and the thickness of the portion 27*a* is less than the thickness of the portion 27*b*. The insulating film 40 is provided on the piezoelectric substrate 10 from the edge region 32 to the region 34*a* where the portions 27*a* of the dummy electrode fingers 24 are located in the dummy region 34, and is not provided in the central region 31 or the region 34*b* where the portions 27*b* of the dummy electrode fingers 24 are located in the dummy region 34. Thus, as illustrated in FIG. 10B, the difference between the acoustic velocity of the surface acoustic wave propagating through the region 34*a* of the dummy region 34 and the acoustic velocity of the surface acoustic wave propagating through the region 34*b* can be reduced, and the difference between the acoustic velocity of the surface acoustic wave propagating through each of the regions 34*a* and 34*b* of the dummy region 34 and the acoustic velocity of the surface acoustic wave propagating through the central region 31 can be reduced. Therefore, lateral-mode spurious emissions can be reduced.

Although the insulating film 40 is preferably provided from the edge region 32 to the boundary between the region 34*a* and the region 34*b* of the dummy region 34 also in the second embodiment, the insulating film 40 may be omitted in a part of the region 34*a* of the dummy region 34 as in the second variation of the first embodiment.

In the second embodiment, the thicknesses T2 of the portions 27*b* of the dummy electrode fingers 24 are equal to the thicknesses of the electrode fingers 23. Thus, the acoustic velocity of the surface acoustic wave propagating through each of the regions 34*a* and 34*b* of the dummy region 34 can be adjusted to be equal to the acoustic velocity of the surface acoustic wave propagating through the central region 31. The term "the thicknesses of the electrode fingers are equal" means that a difference of about manufacturing error is acceptable, and the thickness of one electrode finger is, for example, equal to or greater than 0.95 times and equal to or less than 1.05 times the thickness of the other electrode finger, and may be equal to or greater than 0.98 times and equal to or less than 1.02 times the thickness of the other electrode finger.

In the second embodiment, as in the first embodiment, the acoustic velocity of the surface acoustic wave propagating through the region 34*a* of the dummy region 34 is equal to the acoustic velocity of the surface acoustic wave propagating through the region 34*b*. As a result, the acoustic velocity of the surface acoustic wave propagating through each of the regions 34*a* and 34*b* of the dummy region 34 is likely to be equal to the acoustic velocity of the surface acoustic wave propagating through the central region 31, and thus lateral-mode spurious emissions can be reduced. As in the first embodiment, the acoustic velocity of the surface acoustic wave propagating through the region 34*a* of the dummy region 34, the acoustic velocity of the surface acoustic wave propagating through the region 34*b*, and the acoustic velocity of the surface acoustic wave propagating through the central region 31 are equal. Thus, lateral-mode spurious emissions can be reduced. As in the first embodiment, the length of the gap region 33 in the Y direction is equal to or less than twice the average pitch D of the electrode fingers 23 of the pair of the comb-shaped electrodes 22 (equal to or less than 1λ). In this case, since the insulating film 40 is likely to be formed from the edge region 32 to the dummy region 34 for manufacturing reasons, the thickness T1 of the portion 27*a* of the dummy electrode finger 24 is preferably reduced.

In the second embodiment, in addition to thinning the dummy electrode fingers 24 in the region 34*a* of the dummy region 34, the electrode fingers 23 may be thinned. By combining the first and second embodiments, the widths and thicknesses of the dummy electrode fingers 24 and/or the electrode fingers 23 in the region 34*a* of the dummy region 34 may be reduced.

As described above, in the first and second embodiments, the insulating film 40 is provided from the edge region 32 to the region 34*a*, which is located closer to the overlap region 30, of the dummy region 34, and is not provided in the central region 31 or the region 34*b*, which is located at the side of the bus bar region 35, of the dummy region 34. In the pair of the comb-shaped electrodes 22, the acoustic velocity of the surface acoustic wave propagating through the region 34*a* of the dummy region 34 is equal to the acoustic velocity of the surface acoustic wave propagating through the region 34*b*. Thus, the acoustic velocity of the surface acoustic wave propagating through each of the regions 34*a* and 34*b* of the dummy region 34 is likely to be equal to the acoustic velocity of the surface acoustic wave propagating through the central region 31. As a result, lateral-mode spurious emissions can be reduced.

Third Embodiment

Figure 11A:
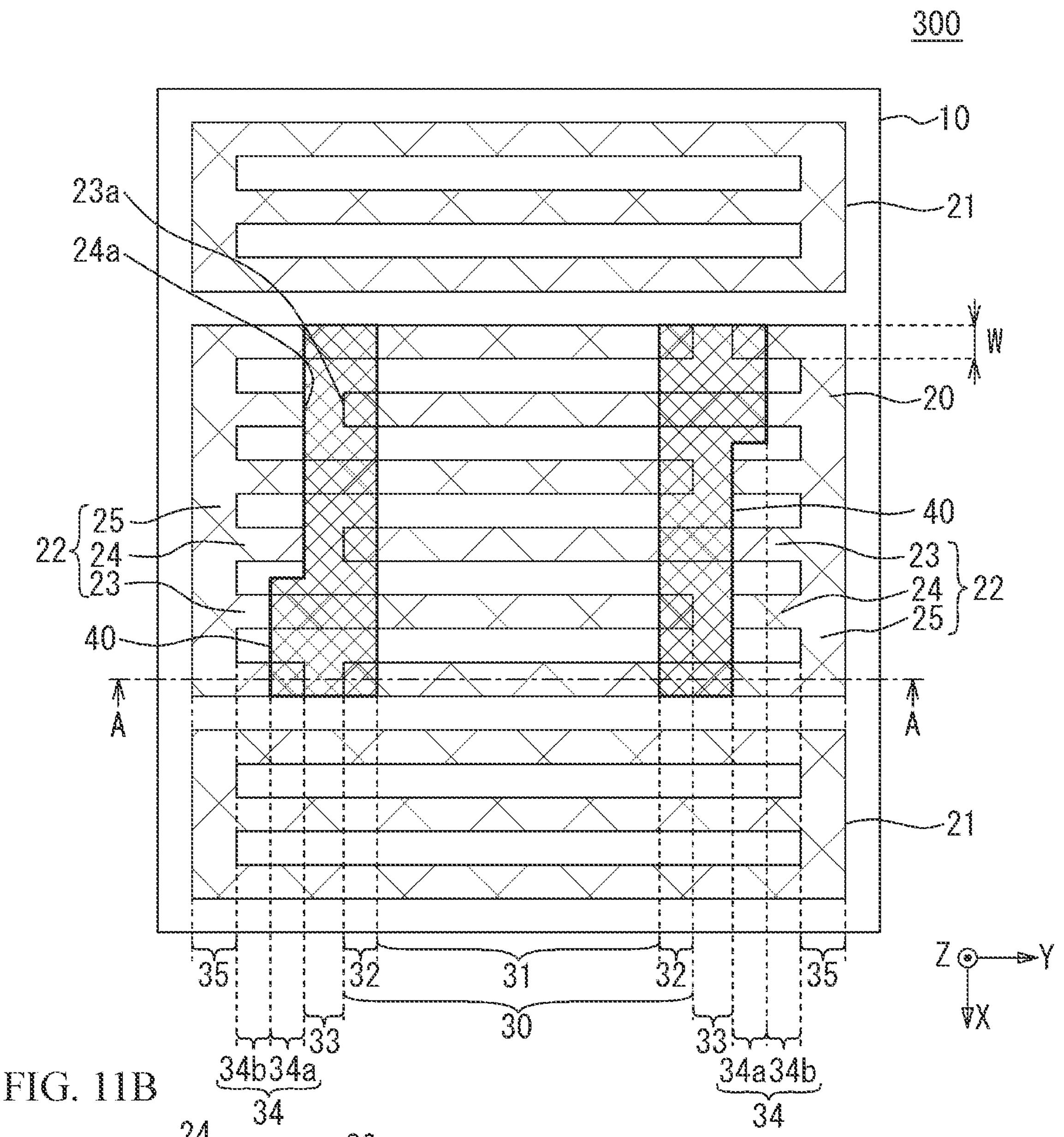
FIG. 11A is a plan view of an acoustic wave resonator in accordance with a third embodiment.
Figure 11B:
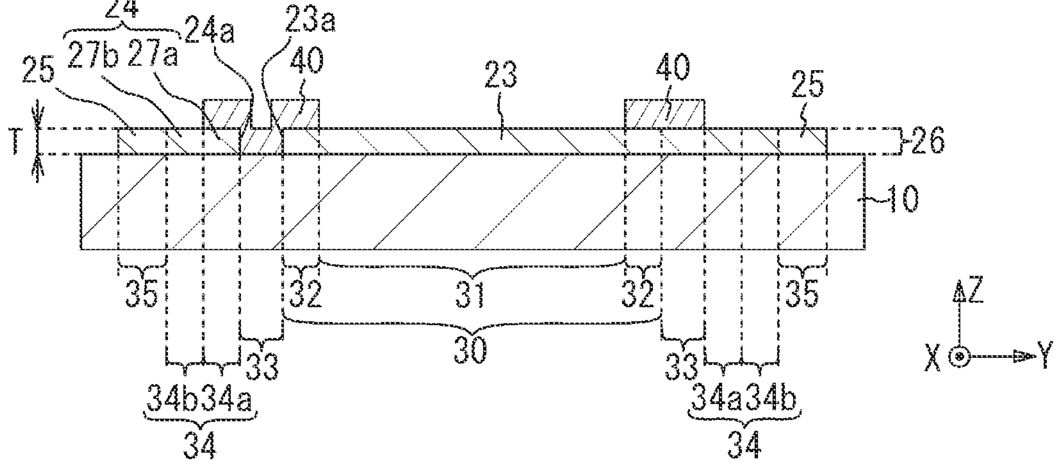
FIG. 11B is a cross-sectional view taken along line A-A in FIG. 11A.

FIG. 11A is a plan view of an acoustic wave resonator 300 in accordance with a third embodiment, and FIG. 11B is a cross-sectional view taken along line A-A in FIG. 11A. As illustrated in FIG. 11A and FIG. 11B, in the acoustic wave resonator 300 of the third embodiment, the width W of the dummy electrode finger 24 in the X direction is substantially constant in the Y direction and is equal to the width of the electrode finger 23 in the X direction. Further, the thickness T of the dummy electrode finger 24 is substantially constant in the Y direction and is equal to the thickness of the electrode finger 23. The insulating film 40 has a portion provided from the edge region 32 to the region 34*a* of the dummy region 34 through the gap region 33, and a portion provided from the edge region 32 to the gap region 33 and not provided in the dummy region 34. That is, the side surface of the insulating film 40 on the bus bar 25 side has an uneven shape. Since the other configurations are the same as those of the first embodiment, description thereof will be omitted.

Figure 12A:
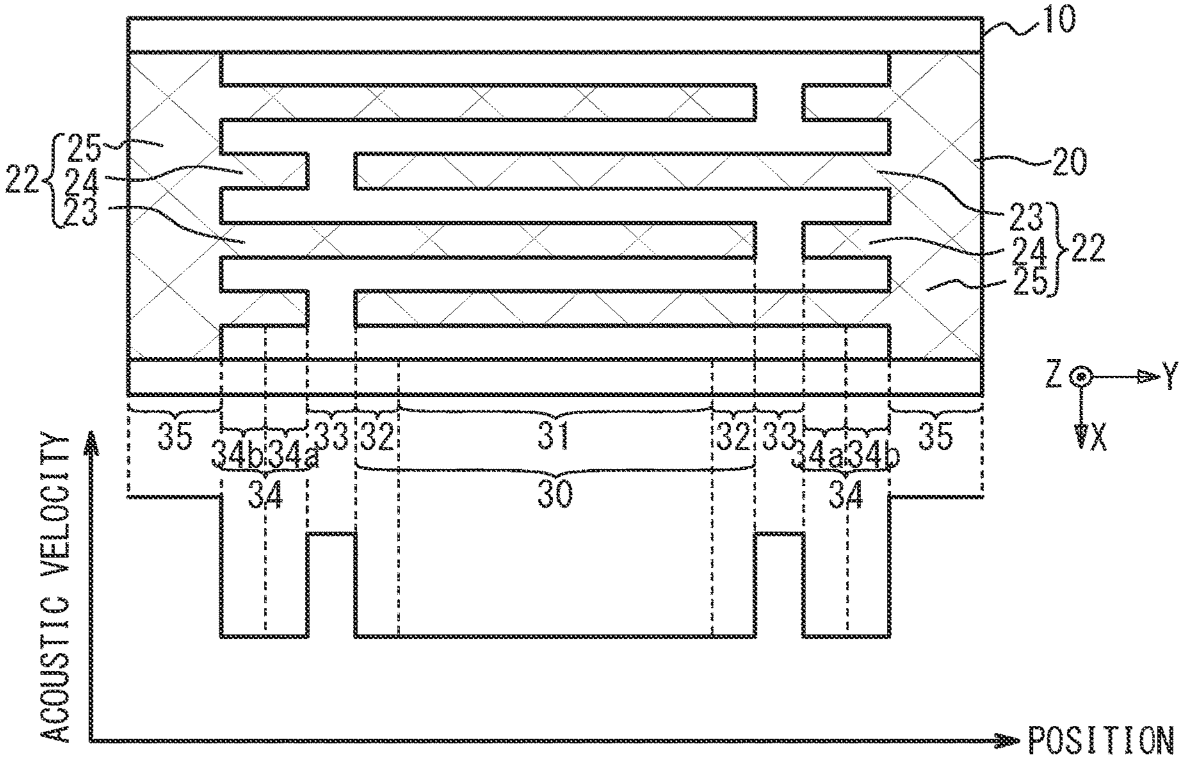
FIG. 12A and FIG. 12B each illustrates acoustic velocities of an acoustic wave in a third embodiment.
Figure 12B:
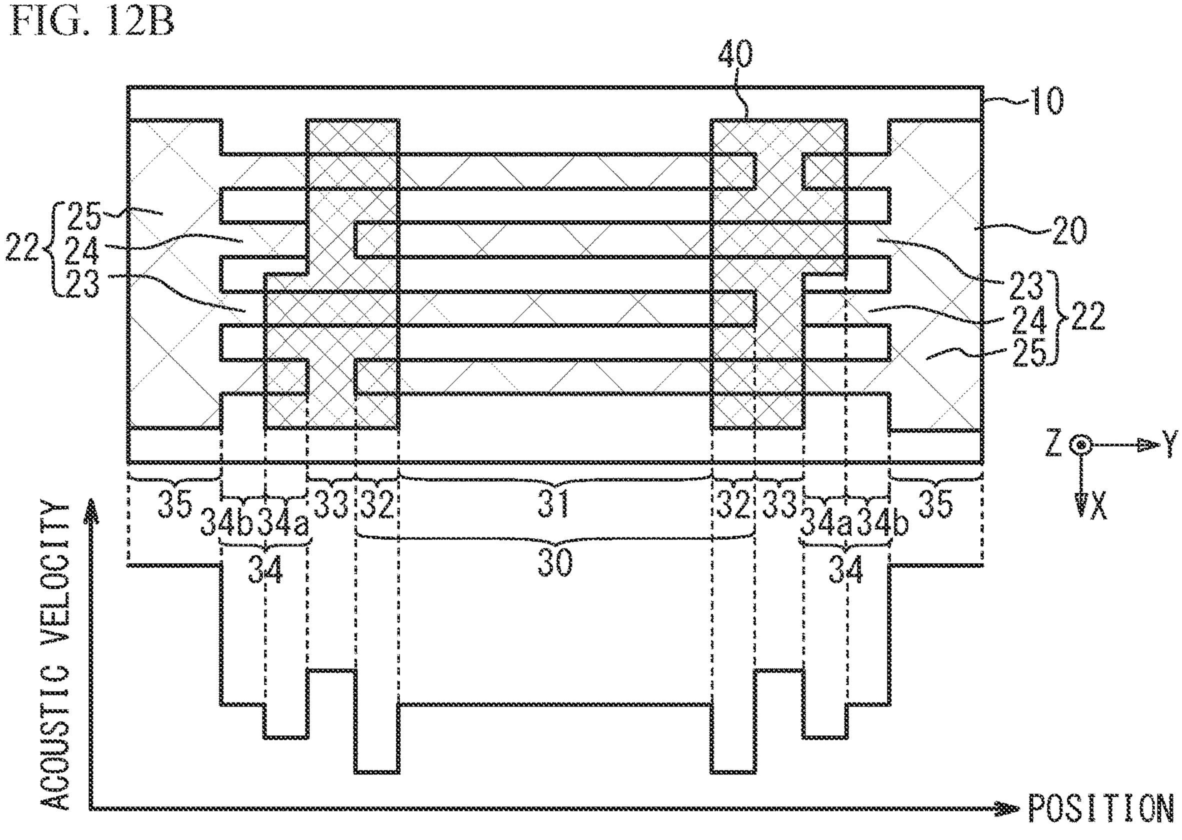

FIG. 12A and FIG. 12B each illustrates acoustic velocities of the acoustic wave in the third embodiment. FIG. 12A illustrates the acoustic velocities before the insulating film 40 is provided, and FIG. 12B illustrates the acoustic velocities after the insulating film 40 is provided. As illustrated in FIG. 12A, since the dummy electrode finger 24 has a substantially constant thicknesses and a substantially constant width in the X direction, the acoustic velocity of the surface acoustic wave propagating through the region 34*a* of the dummy region 34 and the acoustic velocity of the surface acoustic wave propagating through the region 34*b* of the dummy region 34 are equal to each other, and are equal to the acoustic velocity of the surface acoustic wave propagating through the central region 31.

As illustrated in FIG. 12B, when the insulating film 40 is provided from the edge region 32 to the region 34*a* of the dummy region 34 through the gap region 33, the acoustic velocity of the surface acoustic wave propagating through the region 34*a* becomes lower than the acoustic velocity of the surface acoustic wave propagating through each of the region 34*b* and the central region 31. However, since the insulating film 40 is not provided over the entire region 34*a* in the X direction and there is a portion where the insulating film 40 is not provided in the region 34*a*, a decrease in the acoustic velocity of the surface acoustic wave propagating through the region 34*a* is made to be small. Provision of the insulating film 40 causes the acoustic velocity of the surface acoustic wave propagating through the edge region 32 to be lower than the acoustic velocity of the surface acoustic wave propagating through the central region 31. Even after the insulating film 40 is provided, the acoustic velocity of the surface acoustic wave propagating through the gap region 33 remains higher than the acoustic velocity of the surface acoustic wave propagating through the central region 31.

Simulation

By changing the size of the insulating film 40 provided in the region 34*a* of the dummy region 34, how the difference between the acoustic velocity of the surface acoustic wave propagating through the central region 31 and the acoustic velocity of the surface acoustic wave propagating through the region 34*a* changes was simulated. FIG. 13A to FIG. 13D are cross-sectional views of samples A to D used in the simulation, respectively. FIG. 13A to FIG. 13D illustrate cross sections in the region 34*a* of the dummy region 34.

Figure 13A:
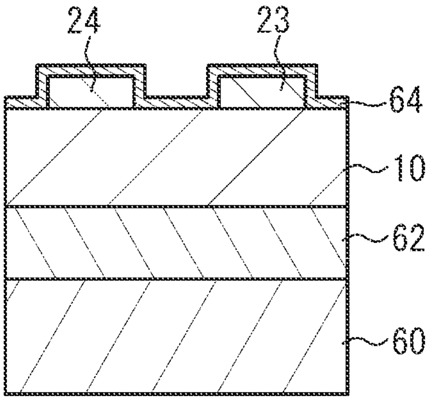
FIG. 13A to FIG. 13D are cross-sectional views of samples used in a simulation.
Figure 13B:
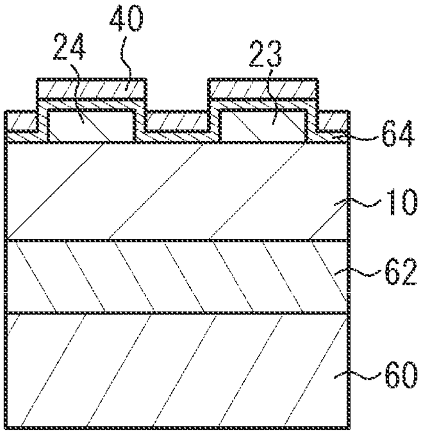

As illustrated in FIG. 13A, in the sample A, the piezoelectric substrate 10 is provided on a support substrate 60 through an insulating film 62. The IDT 20 (only the electrode fingers 23 and the dummy electrode fingers 24 are illustrated) and the reflectors 21 (not illustrated) are provided on the piezoelectric substrate 10. A protective film 64 is provided to cover the IDT 20 and the reflectors 21. The insulating film 40 is not provided in the region 34*a* of the dummy region 34. As illustrated in FIG. 13B, in the sample B, the insulating film 40 is provided on the entire region 34*a* of the dummy region 34. Other configurations are the same as those of the sample A.

Figure 13C:
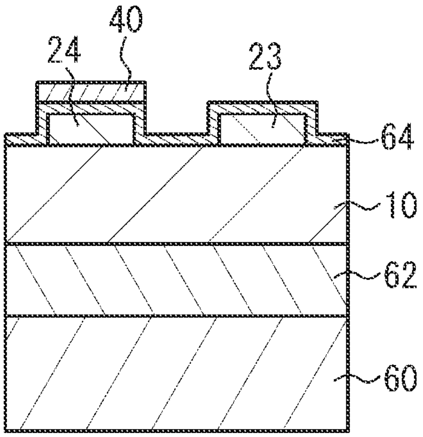
Figure 13D:
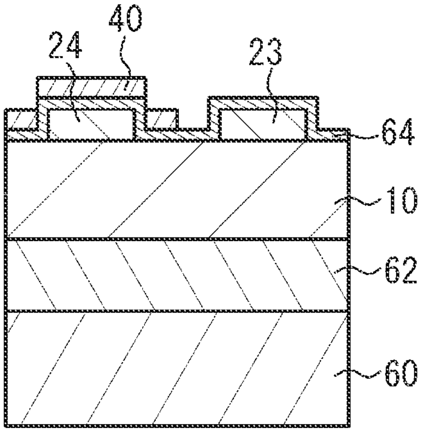

As illustrated in FIG. 13C, in the sample C, the insulating film 40 is provided only on the dummy electrode fingers 24 in the region 34*a* of the dummy region 34. Therefore, while the insulating film 40 covers 100% of the region 34*a* of the dummy region 34 in the sample B, the insulating film 40 covers 25% of the region 34*a* in the sample C. Other configurations are the same as those of the sample A. As illustrated in FIG. 13D, in the sample D, the insulating film is provided between the centers each being located between the dummy electrode finger 24 and each of the adjacent electrode fingers 23 located at both sides of the dummy electrode finger 24 so as to cover the dummy electrode finger 24. Therefore, in the sample D, the insulating film covers 50% of the region 34*a*. Other configurations are the same as those of the sample A.

For the samples A to D, a simulation was performed to evaluate the difference between the acoustic velocity of the surface acoustic wave propagating through the central region 31 and the acoustic velocity of the surface acoustic wave propagating through the region 34*a* of the dummy region 34. The simulation conditions are as follows.

- Support substrate 60: Sapphire substrate
- Insulating film 62: Silicon oxide ($SiO_2$) layer having a thickness of 0.2λ
- Piezoelectric substrate 10: 42° Y-cut X-propagation lithium tantalate substrate having a thickness of 0.3λ
- IDT 20 and the reflectors 21: Aluminum film with a thickness of 0.096λ
- Insulating film 40: Niobium oxide film with a thickness of 0.01λ
- Wavelength λ of the acoustic wave: 2.2 μm
- Duty ratio of the electrode finger 23 and the duty ratio of the dummy electrode finger 24: 50%

The simulation results are presented in Table 1. As presented in Table 1, the resonant frequencies of the samples B to D in which the insulating film 40 was provided in the region 34*a* of the dummy region 34 were lower than that of the sample A in which the insulating film 40 was not provided. This is considered to be due to the mass load effect of the insulating film 40. In the sample B in which the insulating film 40 was provided covering 100% of the region 34*a* of the dummy region 34, the ratio $(((Vc-Va)/Va)\times 100)$ of the acoustic velocity difference between the acoustic velocity Va of the surface acoustic wave propagating through the region 34*a* of the dummy region 34 and the acoustic velocity Vc of the surface acoustic wave propagating through the central region 31 to the acoustic velocity Vc was 1.9%. On the other hand, in the sample C in which the insulating film 40 is provided only on the dummy electrode fingers 24 in the region 34*a* of the dummy region 34 and covers 25% of the region 34*a*, the ratio of the acoustic velocity difference between the acoustic velocity Va and the acoustic velocity Vc to the acoustic velocity Vc was 1.4%. As described above, it was found that the difference between the acoustic velocity Vc of the surface acoustic wave propagating through the central region 31 and the acoustic velocity Va of the surface acoustic wave propagating through the region 34*a* of the dummy region 34 is reduced by reducing the area in which the insulating film 40 is provided in the region 34*a* of the dummy region 34. In addition, in the sample D in which the insulating film 40 is provided from the dummy electrode finger 24 to the space portion, which is located at both sides of the dummy electrode finger 24 and has no electrode finger provided, and covers 50% of the region 34*a* of the dummy region 34, the ratio of the difference between the acoustic velocity Va and the acoustic velocity Vc to the acoustic velocity Vc was 1.1%.

TABLE 1

| | Coverage of additional film (%) | Resonant frequency (MHz) | Acoustic velocity Vc in central region (m/s) | Acoustic velocity Va in dummy region (m/s) | Acoustic velocity difference (%) |
|---|---|---|---|---|---|
| Sample A | 0 | 1712 | 3766.4 | 3766.4 | 0 |
| Sample B | 100 | 1679 | 3766.4 | 3693.8 | 1.9 |
| Sample C | 25 | 1687 | 3766.4 | 3711.4 | 1.4 |
| Sample D | 50 | 1693 | 3766.4 | 3724.6 | 1.1 |

In the third embodiment, the insulating film 40 is provided on the piezoelectric substrate 10 from the edge region 32 to the region 34*a* located closer to the overlap region 30 in the dummy region 34, and the length of the insulating film 40 in the Y direction in the region 34*a* is not uniform in the X direction. The insulating film 40 is not provided in the central region 31 or the region 34*b* located on the bus bar region 35 side of the dummy region 34. Thus, as illustrated in FIG. 12B, after the insulating film 40 is provided, a decrease in the acoustic velocity of the surface acoustic wave propagating through the region 34*a* of the dummy region 34 is reduced, and the difference between the acoustic velocity of the surface acoustic wave propagating through the region 34*a* and the acoustic velocity of the surface acoustic wave propagating through the region 34*b* can be reduced. As a result, the difference between the acoustic velocity of the surface acoustic wave propagating through each of the regions 34*a* and 34*b* of the dummy region 34 and the acoustic velocity of the surface acoustic wave propagating through the central region 31 can be reduced, and lateral-mode spurious emissions can be reduced.

In the third embodiment, the manufacturable minimum widths of the insulating film 40 in the X direction and the Y direction are the same. As the wavelength λ of the surface acoustic wave excited by the IDT 20 increases, the widths of the electrode fingers 23 and the dummy electrode fingers 24 in the X direction increase. In this case, the insulating film 40 may be provided only on the dummy electrode fingers 24 in the region 34*a* of the dummy region 34. As described above, the position and the area of the insulating film 40 in the region 34*a* of the dummy region 34 can be appropriately set.

Fourth Embodiment

Figure 14:
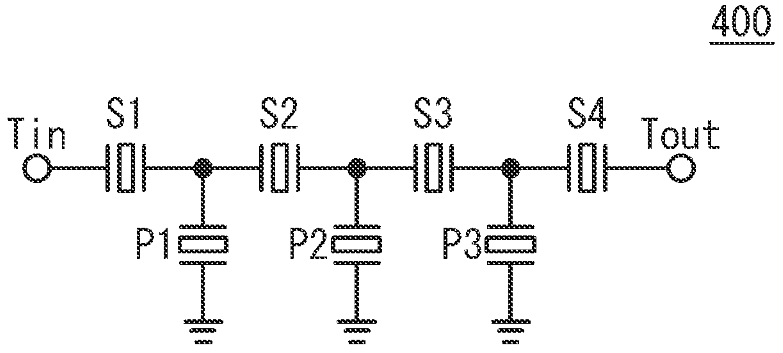
FIG. 14 is a circuit diagram of a filter in accordance with a fourth embodiment.

FIG. 14 is a circuit diagram of a filter 400 in accordance with a fourth embodiment. As illustrated in FIG. 14, one or more series resonators Si to S4 are connected in series between an input terminal Tin and an output terminal Tout. One or more parallel resonators P1 to P3 are connected in parallel between the input terminal Tin and the output terminal Tout. The acoustic wave resonator in accordance with any one of the first to third embodiments may be used for as at least one of the series resonators Si to S4 and the parallel resonators P1 to P3. The number of series resonators and the number of parallel resonators can be set as appropriate. Although the ladder-type filter is illustrated as an example of the filter, the filter may be a multi-mode filter.

Fifth Embodiment

Figure 15:
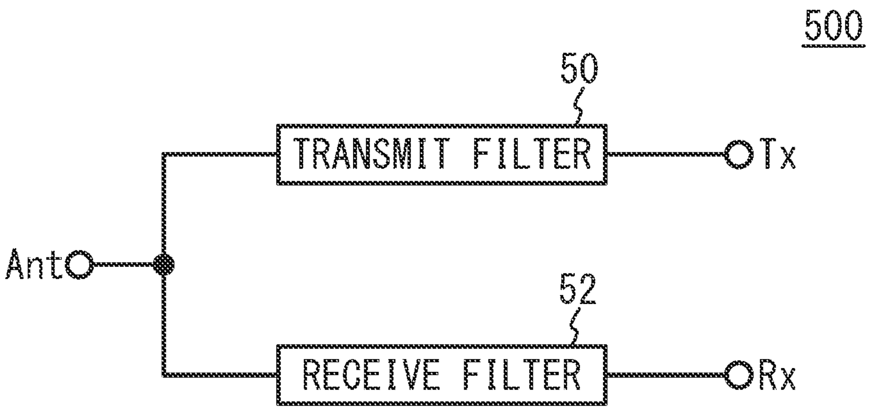
FIG. 15 is a circuit diagram of a duplexer in accordance with a fifth embodiment.

FIG. 15 is a circuit diagram of a duplexer 500 in accordance with a fifth embodiment. As illustrated in FIG. 15, a transmit filter 50 is connected between a common terminal Ant and a transmit terminal Tx. A receive filter 52 is connected between the common terminal Ant and a receive terminal Rx. The transmit filter 50 transmits signals in the transmit band among high-frequency signals input from the transmit terminal Tx to the common terminal Ant as transmit signals, and suppresses signals of other frequencies. The receive filter 52 transmits signals in the receive band among high-frequency signals input from the common terminal Ant to the receive terminal Rx as receive signals, and suppresses signals of other frequencies. At least one of the transmit filter 50 or the receive filter 52 may be the filter of the fourth embodiment. Although the duplexer is illustrated as an example of the multiplexer, the multiplexer may be a triplexer or a quadplexer.

Although the embodiment of the present invention has been described in detail above, the present invention is not limited to the specific embodiment, and various modifications and changes can be made within the scope of the gist of the present invention described in the claims.

What is claimed is:

1. An acoustic wave resonator comprising:

a piezoelectric substrate;

a pair of comb-shaped electrodes provided on the piezoelectric substrate, each of the pair of comb-shaped electrodes including electrode fingers, dummy electrode fingers, and a bus bar to which the electrode fingers and the dummy electrode fingers are connected, first tips of the electrode fingers of one of the pair of comb-shaped electrodes and second tips of the dummy electrode fingers of another of the pair of comb-shaped electrodes facing each other, each of the dummy electrode fingers including a first portion located at a side of the corresponding second tip and a second portion located at an opposite side of the corresponding second tip across the first portion, the first portion having a smaller width in a short direction than the second portion, a length of the first portion in a longitudinal direction of the electrode fingers being equal to or longer than a length of the second portion in the longitudinal direction; and an insulating film that is provided on the piezoelectric substrate from an edge region of an overlap region to a first region of a dummy region and is provided in neither a central region of the overlap region nor a second region of the dummy region, the edge region being a region located at each of edges in the longitudinal direction of the electrode fingers in the overlap region, the overlap region being a region where the electrode fingers of the one of the pair of comb-shaped electrodes overlap the electrode fingers of the another of the pair of comb-shaped electrodes, the first region being a region where the first portions of the dummy electrode fingers are located in the dummy region, the dummy region being a region where the dummy electrode fingers are located, the central region being a region located further in than the edge region in the overlap region, the second region being a region where the second portions of the dummy electrode fingers are located in the dummy region.

2. An acoustic wave resonator comprising:

a piezoelectric substrate;

a pair of comb-shaped electrodes provided on the piezoelectric substrate, each of the pair of comb-shaped electrodes including electrode fingers, dummy electrode fingers, and a bus bar to which the electrode fingers and the dummy electrode fingers are connected, first tips of the electrode fingers of one of the pair of comb-shaped electrodes and second tips of the dummy electrode fingers of another of the pair of comb-shaped electrodes facing each other, each of the dummy electrode fingers including a first portion located at a side of the corresponding second tip and a second portion located at an opposite side of the corresponding second tip across the first portion, the first portion being thinner than the second portion, a length of the first portion in a longitudinal direction of the electrode fingers being equal to or longer than a length of the second portion in the longitudinal direction; and an insulating film that is provided on the piezoelectric substrate from an edge region of an overlap region to a first region of a dummy region and is provided in neither a central region of the overlap region nor a second region of the dummy region, the edge region being a region located at each of edges in the longitudinal direction of the electrode fingers in the overlap region, the overlap region being a region where the electrode fingers of the one of the pair of comb-shaped electrodes and the electrode fingers of the another of the pair of comb-shaped electrodes overlap, the first region being a region where the first portions of the dummy electrode fingers are located in the dummy region, the dummy region being a region where the dummy electrode fingers are located, the central region being a region located further in than the edge region in the overlap region, the second region being a region where the second portions of the dummy electrode fingers are located in the dummy region.

3. An acoustic wave resonator comprising:

a piezoelectric substrate;

a pair of comb-shaped electrodes provided on the piezoelectric substrate, each of the pair of comb-shaped electrodes including electrode fingers, dummy electrode fingers, and a bus bar to which the electrode fingers and the dummy electrode fingers are connected, first tips of the electrode fingers of one of the pair of comb-shaped electrodes and second tips of the dummy electrode fingers of another of the pair of comb-shaped electrodes facing each other, an acoustic wave propagating through a first region of a dummy region being equal to an acoustic wave propagating through a second region of the dummy region, the dummy region being a region where the dummy electrode fingers are located, the first region being a region located closer to an overlap region in the dummy region, the overlap region being a region where the electrode fingers of one of the pair of comb-shaped electrodes and the electrode fingers of the another of the pair of comb-shaped electrodes overlap, the second region being a region located at an opposite side of the overlap region across the first region in the dummy region, a length of the first region in a longitudinal direction of the electrode fingers being equal to or longer than a length of the second region in the longitudinal direction; and an insulating film that is provided on the piezoelectric substrate from an edge region of the overlap region to the first region of the dummy region, and is provided in neither a central region of the overlap region nor the second region of the dummy region, the edge region being a region located at each of edges in the longitudinal direction of the electrode fingers in the overlap region, the central region being a region located further in than the edge region in the overlap region.

4. The acoustic wave resonator according to claim 1, wherein the insulating film is provided on the piezoelectric substrate from the edge region to a boundary between the first region and the second region of the dummy region.

5. The acoustic wave resonator according to claim 2, wherein the insulating film is provided on the piezoelectric substrate from the edge region to a boundary between the first region and the second region of the dummy region.

6. The acoustic wave resonator according to claim 3, wherein the insulating film is provided on the piezoelectric substrate from the edge region to a boundary between the first region and the second region of the dummy region.

7. The acoustic wave resonator according to claim 1, wherein an acoustic velocity of an acoustic wave propagating through the first region of the dummy region is equal to an acoustic velocity of an acoustic wave propagating through the second region of the dummy region.

8. The acoustic wave resonator according to claim 2, wherein an acoustic velocity of an acoustic wave propagating through the first region of the dummy region is equal to an acoustic velocity of an acoustic wave propagating through the second region of the dummy region.

9. The acoustic wave resonator according to claim 3, wherein an acoustic velocity of an acoustic wave propagating through the first region of the dummy region is equal to an acoustic velocity of an acoustic wave propagating through the second region of the dummy region.

10. The acoustic wave resonator according to claim 1, wherein an acoustic velocity of an acoustic wave propagating through the first region of the dummy region, an acoustic velocity of an acoustic wave propagating through the second region of the dummy region, and an acoustic velocity of an acoustic wave propagating through the central region of the overlap region are equal.

11. The acoustic wave resonator according to claim 2, wherein an acoustic velocity of an acoustic wave propagating through the first region of the dummy region, an acoustic velocity of an acoustic wave propagating through the second region of the dummy region, and an acoustic velocity of an acoustic wave propagating through the central region of the overlap region are equal.

12. The acoustic wave resonator according to claim 3, wherein an acoustic velocity of an acoustic wave propagating through the first region of the dummy region, an acoustic velocity of an acoustic wave propagating through the second region of the dummy region, and an acoustic velocity of an acoustic wave propagating through the central region of the overlap region are equal.

13. The acoustic wave resonator according to claim 1, wherein a length of a gap region in the longitudinal direction of the electrode fingers is equal to or less than two times an average pitch of the electrode fingers of the pair of comb-shaped electrodes, the gap region being a region located between the first tips of the electrode fingers of the one of the pair of comb-shaped electrodes and the second tips of the dummy electrode fingers of the another of the comb-shaped electrodes.

14. The acoustic wave resonator according to claim 2, wherein a length of a gap region in the longitudinal direction of the electrode fingers is equal to or less than two times an average pitch of the electrode fingers of the pair of comb-shaped electrodes, the gap region being a region located between the first tips of the electrode fingers of the one of the pair of comb-shaped electrodes and the second tips of the dummy electrode fingers of the another of the comb-shaped electrodes.

15. The acoustic wave resonator according to claim 3, wherein a length of a gap region in the longitudinal direction of the electrode fingers is equal to or less than two times an average pitch of the electrode fingers of the pair of comb-shaped electrodes, the gap region being a region located between the first tips of the electrode fingers of the one of the pair of comb-shaped electrodes and the second tips of the dummy electrode fingers of the another of the comb-shaped electrodes.

16. A filter comprising: the acoustic wave resonator according to claim 1.

17. A filter comprising: the acoustic wave resonator according to claim 2.

18. A filter comprising: the acoustic wave resonator according to claim 3.

19. A multiplexer comprising the filter according to claim 16.

* * * * *